(12) United States Patent
Ogiso

(10) Patent No.: US 7,012,476 B2
(45) Date of Patent: Mar. 14, 2006

(54) VOLTAGE-CONTROLLED OSCILLATOR, CLOCK CONVERTER, AND ELECTRONIC DEVICE

(75) Inventor: Hiroyuki Ogiso, Ina (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/803,465

(22) Filed: Mar. 18, 2004

(65) Prior Publication Data
US 2005/0122179 A1 Jun. 9, 2005

(30) Foreign Application Priority Data
Mar. 20, 2003 (JP) .............................. 2003-078777
Jan. 8, 2004 (JP) .............................. 2004-002966

(51) Int. Cl.
*H03B 5/30* (2006.01)

(52) U.S. Cl. .................. 331/154; 331/107 A; 331/176; 331/66; 331/74

(58) Field of Classification Search ................ 331/154, 331/107 A, 176, 66, 74
See application file for complete search history.

(56) References Cited

U.S. PATENT DOCUMENTS 6,794,948 B1 * 9/2004 Kobayashi et al. ......... 331/154

2003/0090305 A1 * 5/2003 Kobayashi et al. ......... 327/156
2004/0119545 A1 * 6/2004 Ogiso ........................ 331/74

FOREIGN PATENT DOCUMENTS

| JP | 05-110427 | 4/1993 |
|---|---|---|
| JP | 06-061846 | 3/1994 |
| JP | P 3216137 | 3/2001 |
| JP | 2003-032045 | 1/2003 |
| JP | 2003-101347 | 4/2003 |
| JP | 2003-198250 | 7/2003 |

\* cited by examiner

*Primary Examiner*—Arnold Kinkead
(74) *Attorney, Agent, or Firm*—Harness, Dickey & Pierce, P.L.C.

(57) ABSTRACT

A voltage-controlled oscillator includes a voltage-controlled phase-shift circuit, outputting a signal with the shift deviated from an input signal by a specified amount with an external control voltage Vt, a SAW resonator, a buffer, inputting a resonance signal having a specified resonance frequency from the SAW resonator, outputting a clock signal with a desired frequency, and outputting a positive-feedback-oscillation-loop output signal, wherein the voltage-controlled phase-shift circuit, the SAW resonator, and the buffer construct a positive-feedback oscillation loop, in which the frequency temperature characteristic of the SAW resonator is rotated by a specified amount using the temperature characteristic of the propagation delay time of the buffer to correct the frequency temperature characteristic of the SAW resonator.

13 Claims, 26 Drawing Sheets

F I G. 3
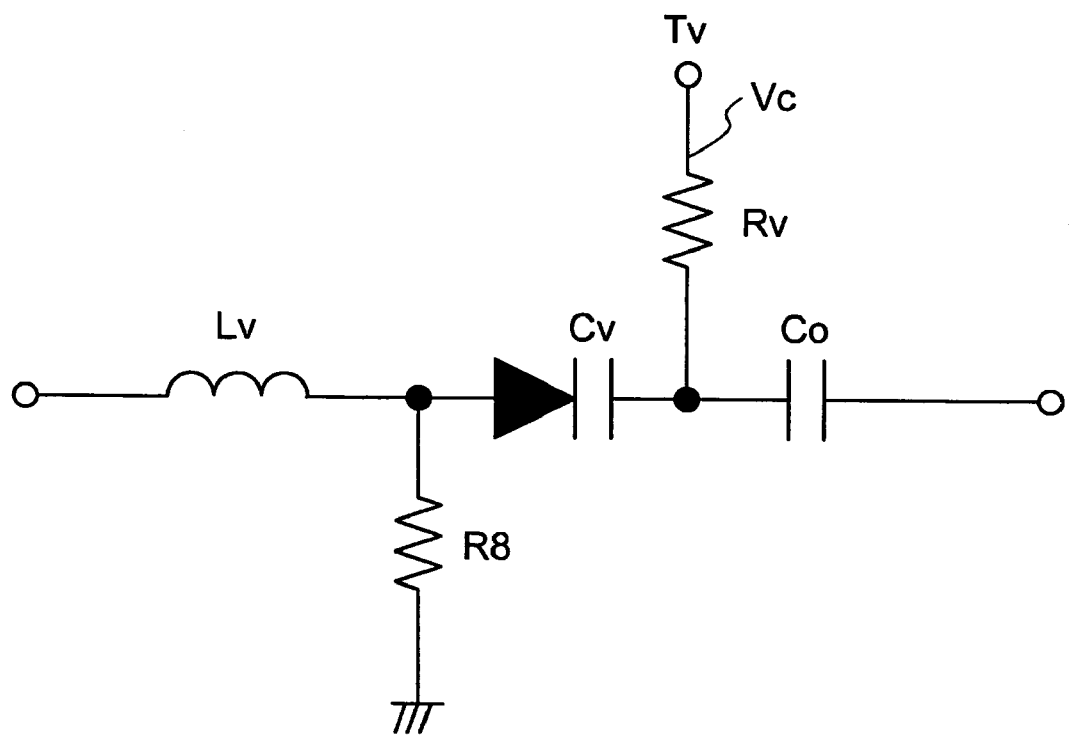

1: QUARTZ CRYSTAL PLATE
2: QUARTZ CRYSTAL Z-PLATE
3: SAW RESONATOR (SURFACE-ACOUSTIC-WAVE ELEMENT)
θ: IN-PLANE ROTATION AXIS AROUND X-AXIS
ψ: IN-PLANE ROTATION AXIS AROUND Z'-AXIS

F I G. 1 6
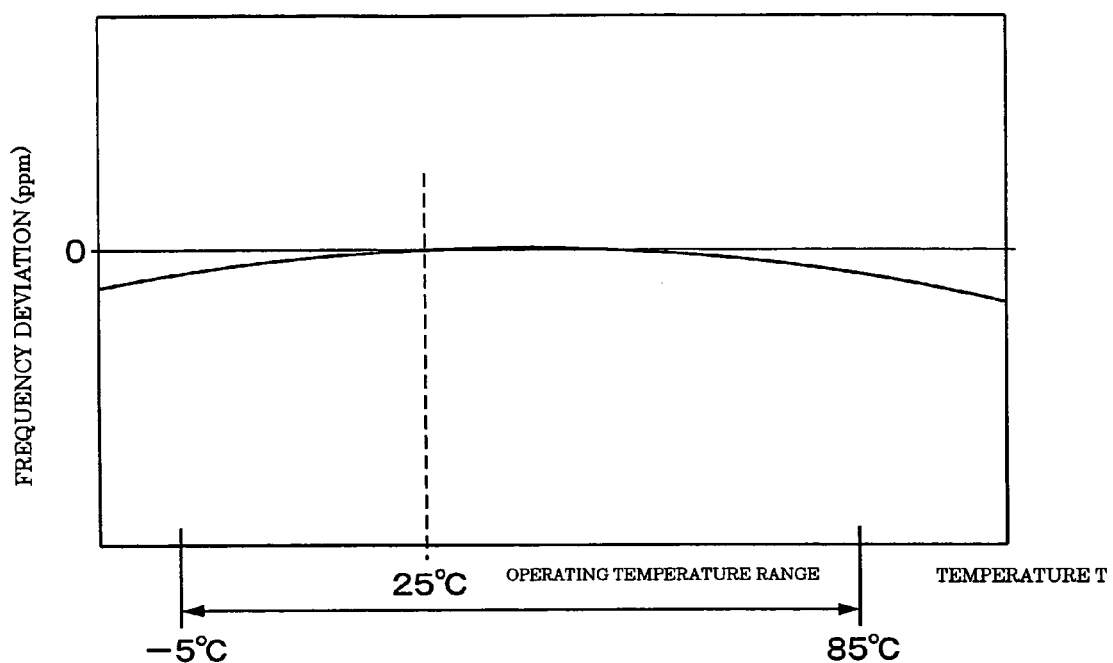

VOLTAGE-CONTROLLED OSCILLATOR, CLOCK CONVERTER, AND ELECTRONIC DEVICE

BACKGROUND

1. Technical Field to which the Invention Belongs

The present invention relates to a voltage-controlled oscillator, a clock converter, and an electronic device and, more specifically, it relates to a voltage-controlled oscillator using a SAW resonator and having little frequency fluctuations caused by itself, a clock converter for converting a fundamental clock signal on the order of several kHz (e.g. 8 kHz) to a high-frequency clock signal of several hundred MHz (e.g. 622.08 MHz), and an electronic device using the clock converter.

2. Related Art

Communication equipment such as cellular phones transmits and receives communication data according to clock signals from oscillators. Market requirements have shifted to a high frequency band exceeding 400 MHz with an increasing trend to broadband communication networks. Data are now transmitted and received in this high frequency band. From the demand for higher communication speed, as for the recent electronic equipment including the communication equipment, high-frequency oscillators to have high frequency stability in a high-frequency band, to compensate the temperature in a practical temperature range of the communication equipment, and to have little jitter in the clock signal outputted from the high-frequency oscillator, is required. Particularly, high-frequency oscillators with extremely low jitter and high stability have been required to prevent the occurrence of communication errors due to the jitter of the high-frequency oscillators in the sharply growing high-speed network market including Ethernet (registered trademark), a fiber channel and so on using a gigabit band.

FIG. 22 is a circuit diagram of the structure of a conventional and general Colpitts voltage-controlled oscillator.

Colpitts voltage-controlled SAW oscillators (VCSOs) 1C using surface acoustic wave (SAW) resonators have recently been used as the voltage-controlled oscillators, as shown in FIG. 22. The SAW resonators work as resonators which have interdigital excitation electrodes and a ladder-form reflector on a piezoelectric substrate and reflect a surface wave excited by the excitation electrodes with the reflector to generate standing waves. The SAW resonators have the advantage of having no resonance point except at a specified frequency, as compared with later-described quartz crystal oscillators, because their oscillating energy is localized on the surface of the SAW resonators to make it difficult to couple with secondary vibrations other than main vibrations. The SAW resonators have resonance frequencies of several hundred MHz to several GHz and are used in high-frequency oscillation circuits.

Known voltage-controlled SAW oscillators (VCSOS) include one having a capacitive reactance circuit 5 including a variable capacitance diode 51, as shown in JP-A-6-061846 (Paragraph 0006, FIG. 1), to compensate the temperature of the voltage-controlled SAW oscillator (VCSO).

Also AT-cut quartz crystal resonators (hereinafter, referred to as AT quartz crystal resonators) which oscillate at several tens of MHz have been used as the oscillation devices of the voltage-controlled oscillators, such as voltage-controlled quartz crystal oscillators (VCXOs).

FIG. 23 is a block diagram of a general voltage-controlled quartz crystal oscillator. In FIG. 23, the voltage-controlled crystal oscillator (VCXO) 1D includes an oscillating section 84 having an AT quartz crystal resonator which oscillates at several tens of MHz and a Colpitts oscillation circuit 81, a multiplexer circuit 82, and a differential conversion circuit 83. The Colpitts oscillation circuit 81 can vary the oscillation frequency in a specified range by the input of an external control voltage Vc. The AT quartz crystal resonator has a limitation of the above-described 155 MHz and as such, includes the multiplexer circuit 82 to output a high-frequency signal of several hundred MHz or more. For example, as shown in FIG. 23, the Colpitts oscillation circuit 81 multiplies the frequency by four times with the multiplexer circuit 82 to output a high-frequency clock signal of 622.08 MHz from a generated clock signal of 155.52 MHz. The voltage-controlled quartz crystal oscillator 1D of FIG. 23 has the differential conversion circuit 83 from which a plurality of outputs is taken to produce a differential output signal, in consideration of the interaction with a load circuit (not shown).

A clock converter for converting a low-frequency clock signal to a high-frequency clock signal, which incorporating the above-described voltage-controlled oscillator (VCO), will now be described.

FIG. 24 is a block diagram of a general clock converter using the voltage-controlled SAW oscillator 1C. A clock converter 50b includes an input frequency divider circuit (division ratio: 1/P) 51, a phase comparator circuit (PD) 52, a loop filter (LF) 53, the voltage-controlled SAW oscillator 1C, a feedback frequency divider circuit (division ratio: 1/N) 54, and a buffer circuit 56. The clock converter 50b adopts the configuration of a general PLL circuit.

A necessary characteristic condition of the clock converter for converting a signal to a high-speed clock signal is that an input clock signal and an output clock signal are in synchronization with each other. Therefore, the conversion ratio of the input clock signal to the output clock signal must be a multiplication of an integral number and the rising and falling of the input clock signal and the output clock signal must coincide with each other. In order to achieve the characteristic conditions, phase synchronization and frequency conversion with a clock converter using a PLL circuit are generally performed. In recent years, a clock converter for high-speed communication has been achieved for converting a fundamental clock signal on the order of several kHz (e.g. 8 KHz) to a high-frequency clock signal of several hundred MHz (e.g. 622.08 MHz) to cope with faster communication speed. As for the clock converter 50b, when a 155.52-MHz clock signal F1 having jitter is inputted to the input frequency divider circuit (division ratio: 1/P) 51, a 622.08-MHz clock signal F2 having reduced jitter is outputted from the buffer circuit 56.

As described above, the clock converter employs the structure of the PLL circuit. Another example of incorporating the structure is a phase synchronization circuit, which feeds a digital-system clock signal, described in JP-A-5-110427 (Paragraph 0010, FIG. 1).

Also an improved SAW resonator whose temperature characteristic is improved (hereinafter, simply referred to as a SAW resonator) has been achieved. Since the SAW resonator uses a quartz crystal strip, cut at an angle that improves the temperature characteristic as compared with the conventional SAW resonators by having a secondary temperature coefficient β of the order of $-1.6 \times 10^{-8}$, and improves the frequency temperature characteristic to about a half of that of the conventional SAW resonators. The device technique for the SAW resonator is described in Japanese Patent No. 3216137.

The above-described voltage-controlled oscillator and clock converter have the following challenges (problems).

The voltage-controlled SAW oscillator including the conventional SAW resonator has the following problems.

(1) FIG. 25 shows a graph of the comparison of the frequency temperature characteristics of an AT quartz crystal resonator and the conventional SAW resonator. As shown in FIG. 25, the conventional SAW resonator has a larger fluctuation in frequency deviation with respect to the temperature change than that of the AT quartz crystal resonator, thus having the problem of requiring a wider frequency variable range of the voltage-controlled SAW oscillator than that of the voltage-controlled quartz crystal oscillator.

The problems will be specifically described with reference to the clock converter shown in FIG. 24.

It is necessary for the clock converter to control the frequency across a wide frequency variable range in order to synchronize a clock signal F1 having a large amount of jitter, inputted from the outside, with a clock signal F2 with reduced jitter at the output end. The system frequency accuracy (hereinafter, referred to as a system accuracy) in a Synchronous Optical NETwork (SONET) system of the United States is ±20 ppm, within which system accuracy must be compensated. As for the system accuracy, the voltage-controlled SAW oscillator in the clock converter takes the role. For example, a frequency variable range required for the voltage-controlled SAW oscillator to compensate the system accuracy includes the following three factors: the SONET-system accuracy, the frequency deviation of the voltage-controlled SAW oscillator itself (hereinafter, referred to as "own deviation"), and frequency fluctuation due to secular change of the voltage-controlled SAW oscillator (hereinafter, referred to as secular change).

The frequency deviation of the voltage-controlled SAW oscillator itself includes frequency deviation in manufacturing (what is called manufacturing variations) and frequency deviation due to own temperature variations shown in FIG. 25. The same situation is considered for the frequency variable range for the voltage-controlled quartz crystal oscillator. Out of the own deviation, the frequency deviation due to temperature change is of the order of 20 ppm for the AT quartz crystal resonator and 60 ppm for the conventional SAW resonator, when the temperature change is in an operating temperature range, as shown in FIG. 25.

(2) The voltage-controlled SAW oscillator has the problem of requiring a wider frequency variable range than that for the voltage-controlled quartz crystal oscillator to compensate the system accuracy due to frequency fluctuations caused by itself.

The problem of the respective frequency variable ranges of the voltage-controlled SAW oscillator and the voltage-controlled quartz crystal oscillator will be specifically described by making a trial calculation.

The frequency variable range of the voltage-controlled SAW oscillator is expressed by system accuracy+own deviation+secular change=±20 ppm+±150 ppm+±10 ppm=±180 ppm. The frequency variable range of the voltage-controlled quartz crystal oscillator is expressed by system accuracy+own deviation+secular change=±20 ppm+±50 ppm+±10 ppm =±80 ppm. As seen from the values of both frequency variable ranges, the frequency variable range of the voltage-controlled SAW oscillator is about 100 ppm larger than that of the voltage-controlled quartz crystal oscillator.

(3) The supply voltage to the oscillation circuit of the clock converter is decreasing in voltage in response to recent lower power consumption. Specifically, the present dominant supply voltage is 3.3 V; however, there is a strong trend to lower supply voltage (e.g. 2.5 V). When the supply voltage is lowered, the control voltage for varying the frequency of the clock signal cannot be greatly varied, thus the necessary frequency variable range is decreased and a possibility of not satisfying the specification of the system accuracy exists. This is also the problem that prevents the requirement for increasing the specification of the system accuracy from being met.

This problem is common to both the voltage-controlled SAW oscillator and the voltage-controlled quartz crystal oscillator. Particularly, the voltage-controlled SAW oscillator has such large self-caused frequency fluctuation that it is difficult to ensure the frequency variable range, thus preventing the system accuracy from being met.

(4) The conventional voltage-controlled oscillators (VCOs) and clock converters using the same have increased in size because of the characteristic and structure, thus having the problem that they cannot respond to the recent requirements for micro-miniaturization and low cost.

This problem will be specifically described.

(4-1) The AT quartz crystal resonator constructing the conventional voltage-controlled quartz crystal oscillator 1D shown in FIG. 23 generates complex vibrations or an unnecessary unwanted mode (or unnecessary vibrations) when secondary vibrations approach to overlap principal vibrations depending on the temperature condition. The multiplexer circuit 82 generates harmonic signals in response to the principal vibrations, from which it selects a necessary harmonic wave as a specified high-frequency signal, thereby converting the frequency. At that time, unnecessary harmonic waves are sometimes left as noise depending on the frequency bands and their level. Consequently, the coupling of the unnecessary vibrations, the unnecessary unwanted mode caused by the AT quartz crystal resonator and the unnecessary harmonic waves generated by the multiplexer circuit 82 become the cause of jitter, thus posing the problem of increasing the jitter of outputted clock signals.

(4-2) The conventional voltage-controlled quartz crystal oscillator 1D, shown in FIG. 23, has the possibility of increasing in size since it requires the multiplexer circuit 82 and the differential conversion circuit 83. As shown in FIG. 1 of JP-A-6-061846 (Paragraph 0006, FIG. 1), the voltage-controlled oscillator additionally needs the capacitive reactance circuit 5 for temperature compensation which includes a variable capacitance diode 51, an inductance 52 and so on, to compensate the temperature change of the equivalent inductance of a SAW resonator 2. Therefore, the increase of the number of components disadvantageously increases the size of the voltage-controlled oscillator.

(4-3) Also the clock converter 50b shown in FIG. 24 has the following structural problems: Since both of a feedback-loop (hereinafter, simply referred to as a "feedback loop") output signal of a PLL-circuit and an output signal of the clock converter 50b are used as the output of the voltage-controlled SAW oscillator, the buffer circuit 56 is needed for reducing the interaction with a load circuit (not shown). This produces the possibility of increasing the size of the clock converter, as in the above. The phase synchronization circuit shown in FIG. 1 of JP-A-5-110427 (Paragraph 0010, FIG. 1) also adopts the structure in which the output signal of a voltage-controlled oscillator 104 serves as both the feedback-loop output signal and the output signal of the phase synchronization circuit, thus having the problem of requiring the buffer circuit, as in the above-described clock converter.

The present invention has been made to solve the above problems. Accordingly, the objects of the invention include the following:

(1) To provide a voltage-controlled oscillator having reduced frequency fluctuations caused from itself and having a small control voltage width.

(2) To provide a voltage-controlled oscillator without the need for a multiplexer circuit and a differential conversion circuit for obtaining a high-frequency oscillation signal and for a dedicated circuit for frequency temperature compensation, thereby achieving micro-miniaturization and low cost.

(3) To provide a voltage-controlled oscillator, in which unnecessary vibration coupling and unwanted mode caused by an oscillation source and unnecessary harmonic waves from a multiplexer circuit are eliminated to reduce jitter.

(4) To provide a clock converter including a voltage-controlled oscillator with little frequency fluctuation and requiring no external buffer circuit.

(5) To provide an electronic device using a micro-miniaturized low-cost clock converter with a narrow control voltage width and reduced jitter, such as an optical network communication device.

SUMMARY

The voltage-controlled oscillator according to the present invention includes a voltage-controlled phase-shift circuit, outputting an output signal with the phase of an input signal shifted by a specified amount according to an external control voltage, a SAW resonator, resonating at a specified resonance frequency, and a buffer, inputting a signal from the SAW resonator and outputting it as a clock signal with a specified frequency, and outputting an output signal for a positive-feedback oscillation loop, wherein the voltage-control phase-shift circuit, the SAW resonator, and the buffer form the positive-feedback oscillation loop, and wherein the frequency temperature characteristic of the SAW resonator is corrected by rotating the frequency temperature characteristic of the SAW resonator by a specified amount using the temperature characteristic of the propagation delay time of the buffer.

Since the above structure uses a SAW resonator, improved in a frequency temperature characteristic, and utilizes the temperature characteristic of the propagation delay time of the buffer to correct the frequency temperature characteristic of the SAW resonator, it offers the advantage of providing a voltage-controlled oscillator having a frequency temperature characteristic at almost the same level as that of the conventional AT quartz crystal resonator.

The voltage-controlled oscillator according to the invention is characterized in that the buffer includes a first differential amplifier, amplifying the signal from the SAW resonator and outputting it, a second differential amplifier, inputting the signal outputted from the first differential amplifier, of which either one of a non-inversion output terminal and an inversion output terminal outputs the positive-feedback-oscillation-loop output signal, and a third differential amplifier, inputting the signal from the first differential amplifier and outputting it as a clock signal with a specified frequency, wherein the propagation delay time of the buffer is propagation delay time between the first differential amplifier and the second differential amplifier connected thereto.

Since the above structure provides a frequency temperature characteristic at almost the same level as that of the conventional AT quartz crystal resonator, the control voltage width of the voltage-controlled phase-shift circuit can be reduced and a necessary frequency variable range can easily be compensated even with a low supply voltage. Also, because there is no need to provide an additional dedicated temperature compensation circuit, the size of the oscillation circuit can be reduced to provide a micro-miniaturized low-price voltage-controlled oscillator. Since secondary vibrations and an unnecessary unwanted mode in the AT cut quartz crystal resonator and harmonic waves in the multiplexer circuit do not occur, which offers the advantage of achieving a voltage-controlled oscillator without the jitter.

The voltage-controlled oscillator according to the present invention is characterized in that the differential amplifier is a differential amplifier circuit using an ECL line receiver.

Since the above structure facilitates circuit integration, it offers the advantages of achieving miniaturization, low power consumption, and high-speed operation of the voltage-controlled oscillator.

The voltage-controlled oscillator according to the invention is characterized in that the buffer includes a first amplifier, amplifying the signal from the SAW resonator and outputting it, a second amplifier, inputting the signal outputted from the first amplifier and outputting it as the positive-feedback-oscillation-loop output signal, and at least one third amplifier, inputting the signal outputted from the first amplifier and outputting it as a clock signal with a specified frequency, wherein the propagation delay time is propagation delay time between the first amplifier and the second amplifier connected thereto.

Since the above structure provides a frequency temperature characteristic at almost the same level as that of the conventional AT quartz crystal resonator, the control voltage width of the voltage-controlled phase-shift circuit can be reduced and a necessary frequency variable range can easily be compensated even with a low supply voltage. Also, because there is no need to provide an additional dedicated temperature compensation circuit, the size of the oscillation circuit can be reduced to provide a micro-miniaturized low-price voltage-controlled oscillator. Since secondary vibrations and an unnecessary unwanted mode in the AT cut quartz crystal resonator and harmonic waves in the multiplexer circuit do not occur, which offers the advantage of achieving a voltage-controlled oscillator without the jitter. Since a feedback-loop output signal is outputted from the third amplifier in the buffer, there is no need to provide an additional external buffer circuit outside the buffer. As a result of eliminating the necessity for the buffer circuit, the number of components of the voltage-controlled oscillator can be reduced to allow micro-miniaturization and low price. The output signal from the first amplifier can be distributed to the plurality of third amplifiers in the buffer, which offers the advantage of generating no phase difference between the feedback-loop output signal and the externally outputted clock signals.

The voltage-controlled oscillator according to the invention is characterized in that the SAW resonator uses an in-plane rotated ST-cut quartz crystal plate with Euler angles of (0, 113° to 135°, ±(40° to 49°)).

Since the above structure adopts a SAW resonator using the ST-cut quartz crystal plate in consideration of Euler angles, as described above, a frequency temperature characteristic superior to that of the conventional SAW resonators can be provided. For example, the frequency temperature characteristic of the SAW resonator of the invention is advantageously improved to about a half of that of the conventional SAW resonators at −5° C.

The voltage-controlled oscillator according to the present invention is characterized by further including an impedance circuit, generating a specified potential difference between the non-inversion input terminal and the inversion input terminal of the buffer, and an NTC thermistor, having a negative temperature characteristic in parallel to the impedance circuit, between the non-inversion input terminal of the buffer and the terminal of the SAW resonator adjacent to the downstream of the feedback loop.

Since the above structure greatly changes the phase of the NTC thermistor of the resonant circuit at a high-temperature range, the frequency temperature characteristic of the feedback-type voltage-controlled SAW oscillation circuit is improved, which offers the advantages of providing an oscillation circuit with a stable frequency even at high ambient temperature.

A clock converter according to the present invention forms a feedback loop constructed of a voltage-controlled oscillator, in which the frequency varies depending on a supplied control voltage and which outputs a feedback-loop output signal, a phase comparing section, comparing the phases of the feedback-loop output signal from the voltage-controlled oscillator and an external input signal to output a phase-difference signal, and a loop filter, smoothing the phase difference signal to generate the control voltage. The voltage-controlled oscillator includes a voltage-controlled phase-shift circuit, outputting an output signal with the phase of the input signal shifted by a specified amount according to the control voltage, a SAW resonator, resonating at a specified resonance frequency, and a buffer, inputting a signal from the SAW resonator and outputting it as a clock signal with a specified frequency, and outputting an output signal for a positive-feedback oscillation loop and the feedback-loop output signal, wherein the voltage-controlled phase-shift circuit, the SAW resonator, and the buffer form a positive-feedback oscillation loop. The frequency temperature characteristic of the SAW resonator is corrected by rotating the frequency temperature characteristic of the SAW resonator by a specified amount using the temperature characteristic of the propagation delay time of the buffer.

The above structure provides a clock converter that meets the system accuracy required from a market with a narrow control voltage width by using a voltage-controlled SAW oscillator, in which a frequency temperature characteristic at almost the same level as that of the AT quartz crystal resonator is ensured. Also, many margins can be ensured for the frequency variable range with the conventional control voltage width, which offers the advantage of easily responding to the specification change that increases system accuracy, requested from the system.

The clock converter according to the present invention is characterized in that the buffer includes a first differential amplifier, amplifying the signal from the SAW resonator and outputting it, a second differential amplifier, inputting the signal outputted from the first differential amplifier, of which either one of a non-inversion output terminal and an inversion output terminal outputs the feedback-loop output signal and the other output terminal outputs the positive-feedback-oscillation-loop output signal, and a third differential amplifier, inputting the signal from the first differential amplifier and outputting it as a clock signal with a specified frequency, wherein the propagation delay time of the buffer is propagation delay time between the first differential amplifier and the second differential amplifier connected thereto.

With the above structure, the frequency of the voltage-controlled SAW oscillator can be controlled at a narrow control voltage width. As a result, the frequency variable range can easily be compensated even with a low supply voltage, thus maintaining high-accuracy frequency deviation of the converted clock signals. Furthermore, there is no need to provide an external buffer circuit for the output of the voltage-controlled SAW oscillator, thus offering the advantage of providing a micro-miniaturized and low-price clock converter.

A clock converter according to the present invention is characterized in that the differential amplifier is differential amplifier circuit using an ECL line receiver.

The above structure facilitates circuit integration, thus offering the advantage of providing a compact and inexpensive clock converter capable of high-speed operation using a miniaturized and power-saving voltage-controlled SAW oscillator.

A clock converter according to the present invention is characterized in that the buffer includes a first amplifier, amplifying the signal from the SAW resonator and outputting it, a second amplifier, inputting the signal outputted from the first amplifier and outputting it as the output signal for the positive-feedback oscillation loop, and a plurality of third amplifiers, inputting the signal outputted from the first amplifier, outputting at least one clock signal having a specified frequency, and outputting the feedback-loop output signal, wherein the propagation delay time is propagation delay time between the first amplifier and the second amplifier connected thereto.

With the above structure, the frequency of the voltage-controlled SAW oscillator can be controlled at a narrow control voltage width. As a result, the frequency variable range can easily be compensated even with a low supply voltage, thus maintaining high-accuracy frequency deviation of the converted clock signals. Furthermore, there is no need to provide an external buffer circuit for the output of the voltage-controlled SAW oscillator, decreasing the number of components, thus offering the advantage of providing a micro-miniaturized and low-price clock converter.

A clock converter according to the invention is characterized in that the SAW resonator uses an in-plane rotated ST-cut quartz crystal plate with Euler angles of (0, 113° to 135°,±(40° to 49°)).

The above structure adopts a voltage-controlled SAW oscillator including a SAW resonator using the ST-cut quartz crystal plate in consideration of Euler angles, as described above, offering the advantage of providing a clock converter having a preferable frequency temperature characteristic.

A clock converter according to the invention is characterized by further including an impedance circuit, generating a specified potential difference between the non-inversion input terminal and the inversion input terminal of the buffer, and an NTC thermistor having a negative temperature characteristic in parallel to the impedance circuit, between the non-inversion input terminal of the buffer and the terminal of the SAW resonator adjacent to the downstream of the feedback loop.

Since the above structure greatly changes the phase of the NTC thermistor at a high-temperature range, the frequency temperature characteristic of the feedback-type voltage-controlled SAW oscillation circuit is improved, which offers the advantages of providing a clock converter with a stable frequency even at high ambient temperature.

An electronic device according to the present invention is characterized by including the above-described clock converter.

With the above structure, the frequency variable range can be compensated even at a narrow control voltage width and as such, the frequency deviation of the converted clock signals can be maintained highly accurate. Accordingly, a timing margin can be assured between the transmission/reception data and clock signals according to clock signals, in which unnecessary jitter has been significantly reduced even when clock signals having a large amount of jitter are inputted. Thus, electronic devices incorporating the clock converter according to the present invention, such as an optical transceiver module, can perform stable data transmission and reception via an optical network over a wide ambient temperature without malfunctioning. Furthermore, since a clock converter is provided, which uses the microminiaturized and low-price voltage-controlled oscillator which requires no dedicated temperature compensator circuit for correcting the frequency temperature characteristic of the SAW resonator, the optical transceiver module can be advantageously reduced in size and price.

BRIEF DESCRIPTION OF THE DRAWINGS

FIG. 3 is a circuit diagram of a voltage-controlled phase-shift circuit.

FIGS. 8(a) and (b) are graphs of a phase-vs.-frequency characteristic of the SAW resonator, wherein FIG. 8(a) is a correlation graph of the propagation delay time and the temperature characteristic of a buffer 2a as an example.

FIG. 16 is a graph of an example of the temperature characteristic of the oscillation frequency of the voltage-controlled SAW oscillator.

DETAILED DESCRIPTION

Embodiments of the present invention will be specifically described hereinafter with reference to the drawings.

First Embodiment

A first embodiment will be described at first.

(1) Structure of the Embodiment

Structure of Voltage-Controlled SAW Oscillator

Figure 1:
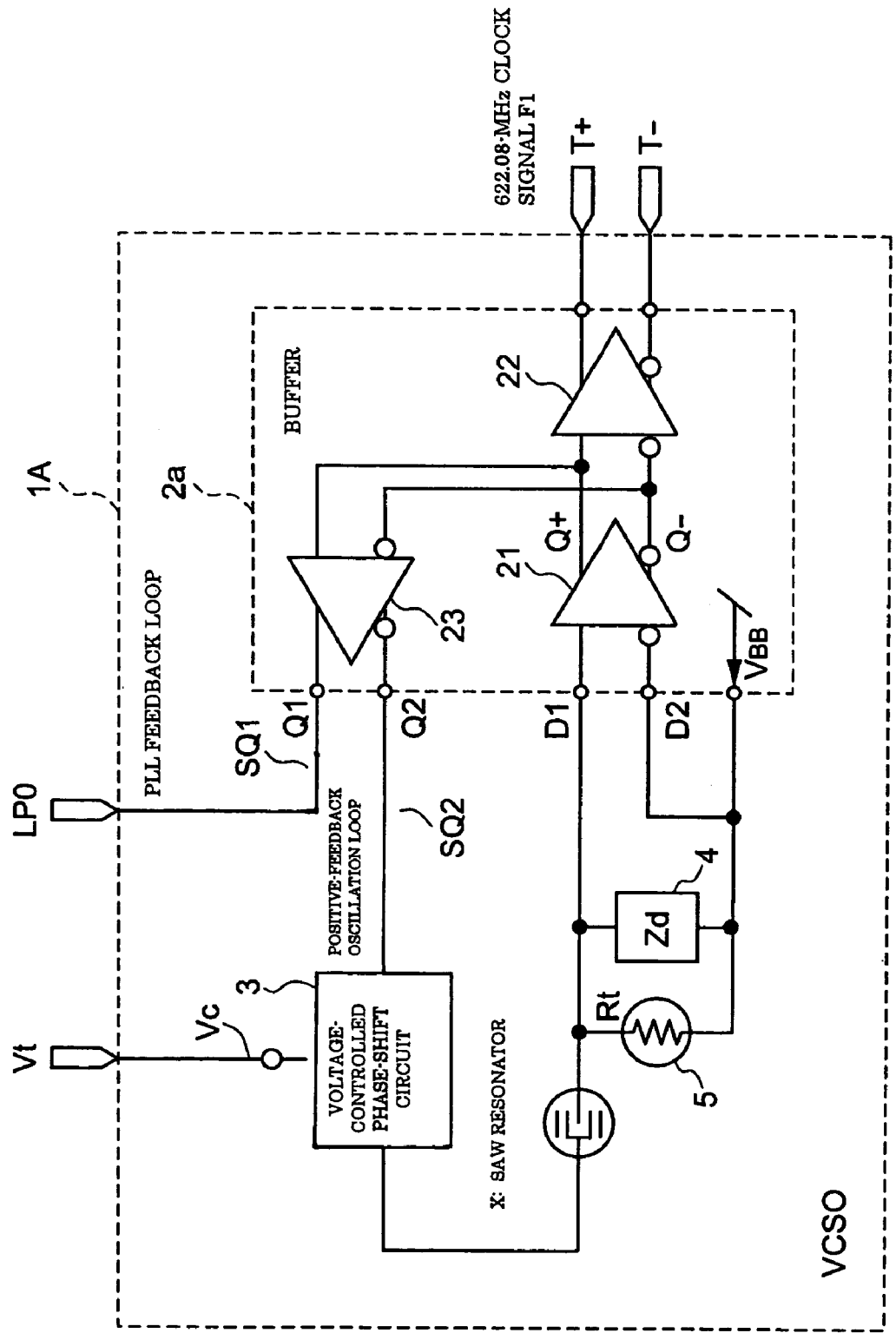
FIG. 1 is a block diagram of a voltage-controlled SAW oscillator according to a first embodiment.

FIG. 1 is a block diagram of a voltage-controlled SAW oscillator 1A. The voltage-controlled SAW oscillator 1A includes a buffer 2a having three differential amplifiers 21, 22, and 23 built in, a SAW resonator X which resonates at a specified frequency, a voltage-controlled phase-shift circuit 3 for shifting the phase of the oscillation signal by a specified amount according to an external control voltage Vc to vary the resonance frequency of the SAW resonator X, an impedance circuit (Zd) 4, and an NTC thermistor (Rt) 5 is connected to the impedance circuit (Zd) 4 in parallel. At least the oscillating differential amplifier (first differential amplifier) 21, the feedback-buffer differential amplifier (second differential amplifier) 23, the voltage-controlled phase-shift circuit 3, and the SAW resonator X form a positive-feedback oscillation loop.

A reference bias voltage $V_{BB}$ outputted from the buffer 2a is applied from the outside thereof to an inversion input terminal D2 of the oscillating differential amplifier 21.

The embodiment uses the SAW resonator X, improved in a frequency temperature characteristic from the conventional SAW resonator, and utilizes the temperature characteristic of the propagation delay time of the buffer 2a. More specifically, correcting the frequency temperature characteristic of the SAW resonator X utilizing the frequency temperature characteristic of the propagation delay time allows almost the same level of frequency temperature characteristic of the voltage-controlled SAW oscillator 1A as that with the AT quartz crystal resonator to be provided.

Figure 2:
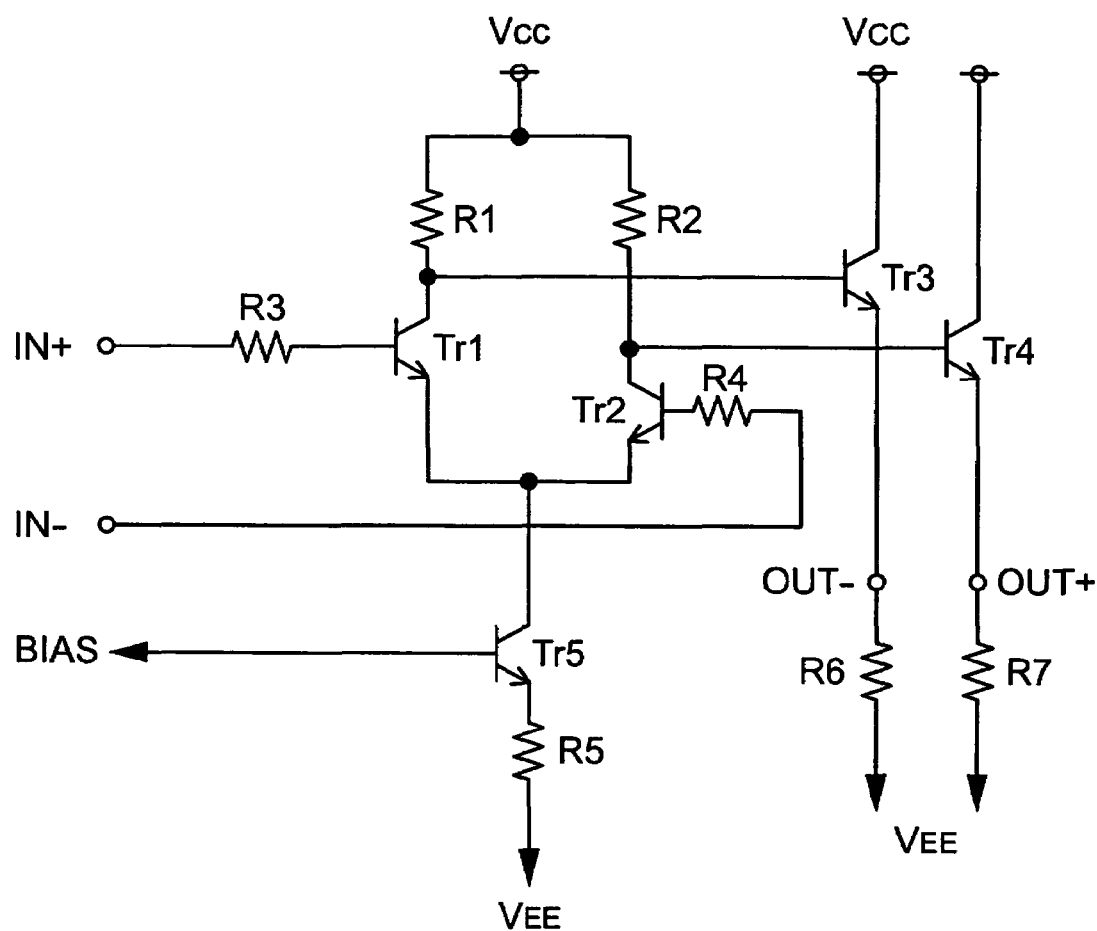
FIG. 2 is a circuit diagram of an ECL line receiver.

FIG. 2 is a circuit diagram of an ECL line receiver.

The three differential amplifiers 21, 22, and 23 are differential amplifier circuits using the emitter-coupled logic (ECL) line receiver shown in FIG. 2. Since the ECL line receiver consumes little electricity and is capable of high-speed operation, it is used for high-frequency oscillators. As shown in FIG. 2, the differential amplifiers 21, 22, and 23 for amplifying the resonance signal from the SAW resonator X are constructed of a differential amplifier circuit using the ECL line receiver, thus facilitating circuit integration to allow size reduction of the voltage-controlled SAW oscillator 1A.

In the oscillating differential amplifier 21, a signal with a specified resonance frequency f from the SAW resonator X is inputted to a non-inversion input terminal D1 of the oscillating differential amplifier 21. Output signals with a mutual phase difference of 180 degrees are outputted from a non-inversion output terminal Q+ and an inversion output terminal Q−.

The output differential amplifier (third differential amplifier) 22 shapes the waveform of the output signal from the oscillating differential amplifier 21 and outputs it as a clock signal F with a specified oscillation frequency, e.g. 622.08 MHz.

The feedback-buffer differential amplifier 23 has a buffer function, in which either of output terminals Q1 and Q2 is used as the output terminal for the feedback oscillation loop.

An emitter termination resistor (not shown) is connected to each of the output terminals Q1 and Q2 of the feedback-buffer differential amplifier 23, using the ECL line receiver, as an external device of the buffer 2a. FIG. 2 shows a state in which emitter termination resistors R6 and R7 are connected to output terminals OUT− and OUT+, respectively.

FIG. 3 is a circuit diagram of a specific configuration of the voltage-controlled phase-shift circuit 3. The voltage-controlled phase-shift circuit 3 controls either one of output signals SQ1 and SQ2 from the feedback-buffer differential amplifier 23 to a specified phase to meet the phase condition of the voltage-controlled SAW oscillator 1A according to the external control voltage Vc.

The impedance circuit (Zd) 4 is connected between the non-inversion and inversion input terminals of the oscillating differential amplifier 21 so as to generate a potential difference therebetween.

The oscillating signal generated in the positive-feedback oscillation loop is outputted from output terminals T+ and T− as a clock signal through the differential amplifiers 21 and 22 of FIG. 1.

Output Terminal of Feedback-Buffer Differential Amplifier

The embodiment uses the dead output terminal Q1 of the feedback-buffer differential amplifier 23 for other than the output of the positive-feedback oscillation loop. Specifically, the output terminal Q1 is used as the output of a feedback-loop output signal of a later-described clock converter via an output terminal LP0.

Figure 18:
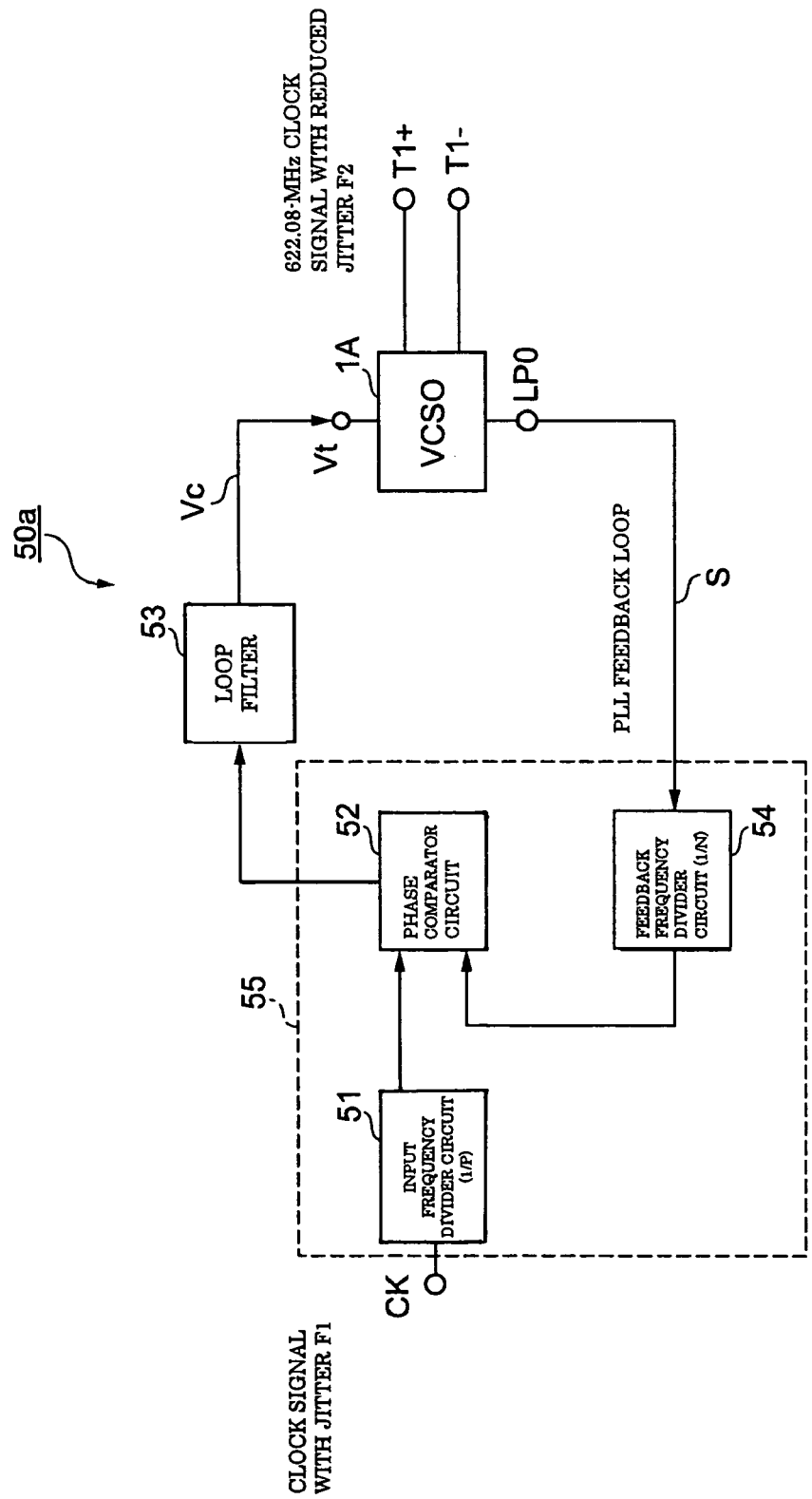
FIG. 18 is a block diagram of a clock converter incorporating the voltage-controlled SAW oscillator of the first embodiment, according to a third embodiment.

Referring to FIG. 1, a feedback-loop output signal of a later-described clock converter, shown in FIG. 18, is outputted via the output terminal LP0 of the voltage-controlled SAW oscillator 1A. Alternatively, the positive-feedback-oscillation-loop output signal may be outputted from the output terminal Q1 and the feedback-loop output signal may be outputted from the output terminal Q2, respectively.

(2) An improvement in a frequency temperature characteristic of the SAW resonator and the SAW resonator, improved in a frequency temperature characteristic from the conventional SAW resonator, will be described.

Voltage-controlled SAW oscillators using the conventional SAW resonators are currently common to respond to higher-frequency voltage-controlled quartz crystal oscillators using the conventional AT quartz crystal resonators. However, as described in the BACKGROUND section above, the conventional SAW resonators have large frequency fluctuations relative to temperature changes, thus setting a small margin of the frequency variable range for compensating the system accuracy. In place of that, a SAW resonator improved in temperature characteristic has been achieved.

A SAW resonator used in this embodiment uses a quartz crystal strip, cut at an angle that improves the temperature characteristic as compared with the conventional SAW resonators. The SAW resonator has a secondary temperature coefficient $\beta$ of the order of $-1.6 \times 10^{-8}$, with the frequency temperature characteristic improved to about a half of that of the conventional SAW resonators. The SAW resonator used in this embodiment will be specifically described hereinafter.

Figure 4:
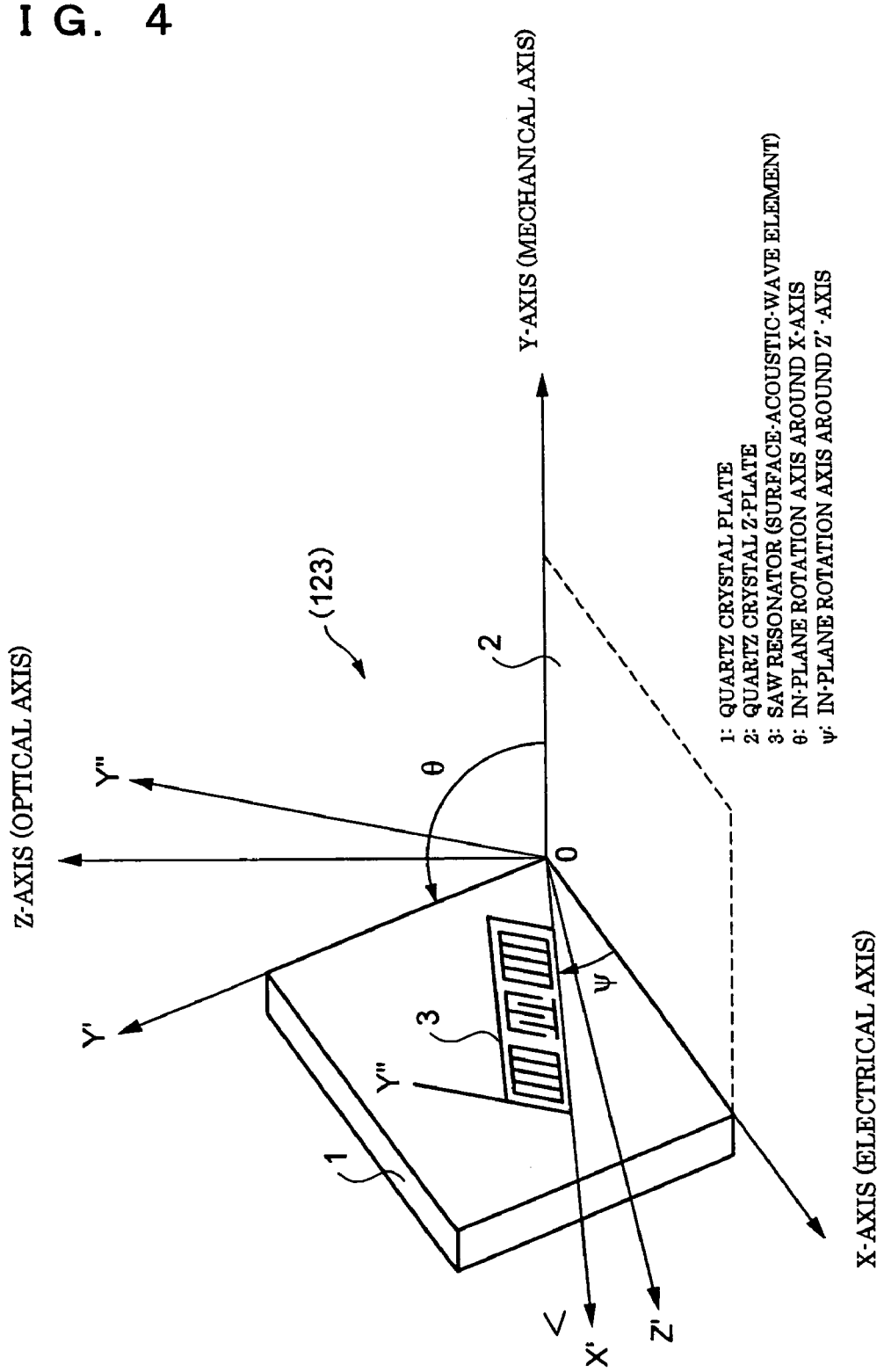
FIG. 4 is a diagram of the cut angle of a quartz crystal strip used in a SAW resonator with respect to the quartz crystal axis.

FIG. 4 shows the cut angle of the quartz crystal strip used in the SAW resonator of this embodiment relative to the quartz crystal axis. As shown in FIG. 4, the quartz crystal axis is defined by the electrical axis (X-axis), the mechanical axis (Y-axis), and the optical axis (Z-axis). A quartz crystal plate 1 is obtained by rotating a quartz crystal Z-plate 2 with Euler angles ($\phi$, $\theta$, $\psi$) of (0, 0, 0) around the electrical axis (X-axis) by $\theta$=113 to 135 degrees and is cut out along the quartz crystal axes (X, Y', Z'). The cutting method is called an ST-cut. The ST-cut quartz crystal plate 1 is further rotated around the Z'-axis by $\psi = \pm(40$ to $49)$ degrees so that the surface acoustic wave propagates in this direction to produce a piezoelectric resonator. This piezoelectric resonator is the ST-cut SAW resonator X rotated in plane around the Z'-axis.

It is known that the ST-cut SAW resonator X by in-plane rotation has a low frequency change ratio and an extremely favorable temperature characteristic. The temperature characteristic is a cubic-function of temperature characteristic with an inflection point of about 110° C. The SAW resonator X is constructed such that the temperature characteristic is turned around an inflection point located out of a normal-temperature range by adjusting the linear coefficient term, with the maximum or minimum temperature within the normal temperature range as the peak temperature in the cubic-function temperature characteristic, thereby controlling the peak temperature to an optimum value in the normal temperature range.

Specifically, the ST-cut quartz crystal plate 1 obtained by rotating a quartz crystal plate around the electrical axis (X-axis) by $\theta$=113 to 135 degrees is further turned in plane around the Z'-axis by $\psi = \pm(40$ to $49)$ degrees to set an ST-cut quartz crystal plate (quartz crystal strip). Within the range, a range where the temperature characteristic has an extreme value is selected, within which the in-plane rotation angle is adjusted to adjust the maximum or minimum temperature of the temperature characteristic to an optimum value in the normal temperature range, thereby controlling the temperature characteristic. This is shown in FIG. 5.

Figure 5:
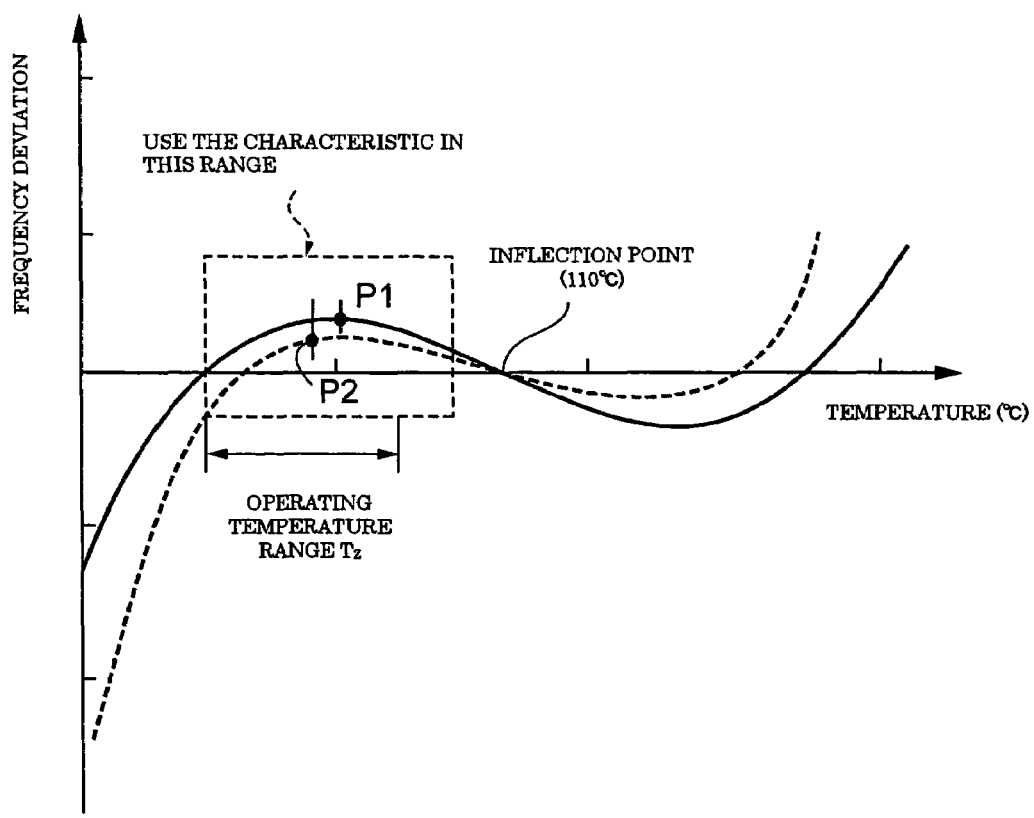
FIG. 5 is a graph of the frequency temperature characteristic of the SAW resonator.

FIG. 5 is a graph of the frequency temperature characteristic of the SAW resonator according to the embodiment. As shown in FIG. 5, the temperature characteristic of the ST-cut SAW resonator that is rotated in plane around the Z'-axis has an inflection-point temperature of about 110° C. and a normal temperature range of −40° C. to +85° C. lower than that. Accordingly, a characteristic range, having the maximum value located in a temperature range lower than the inflection point, is used (a part surrounded by the rectangular in FIG. 5). Since it is difficult for the cubic-function temperature characteristic to shift the inflection point, the linear coefficient term is adjusted to rotate the characteristic line around the inflection point.

When the solid line shown in FIG. 5 is a fundamental characteristic curve, the characteristic curve is rotated around the inflection point to obtain the characteristic curve indicated by the broken line so that its maximum value P1 is located in the center of an operating temperature range Tz. Thus, the maximum temperature shifts from P1 to P2 as if the peak temperature shifted in parallel in the operating temperature range, thus minimizing the frequency change ratio in the operating temperature range.

Figure 6:
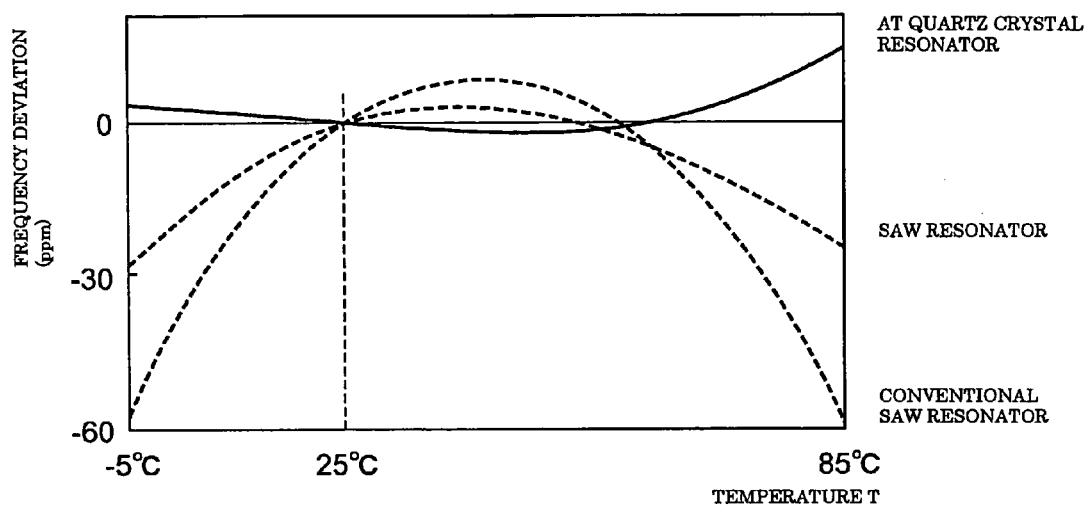
FIG. 6 is a comparative graph of the frequency temperature characteristic of the SAW resonator relative to those of an AT quartz crystal resonator and a conventional SAW resonator.

FIG. 6 is a comparative graph of the frequency temperature characteristics of an AT quartz crystal resonator, the conventional SAW resonator, and the SAW resonator of this embodiment. Their respective frequencies are 80 MHz for the AT quartz crystal resonator, 125 MHz for the conventional SAW resonator, and 625 MHz for the SAW resonator of this embodiment; however, the fundamental frequency temperature characteristics do not depend on the frequency used.

(3) A method for further correcting the frequency temperature characteristic of the SAW resonator of this embodiment will now be described in correcting the frequency temperature characteristic using propagation delay time.

Referring to FIG. 6, the SAW resonator of this embodiment is inferior in a frequency temperature characteristic to the conventional AT quartz crystal resonator. Therefore, in this embodiment, the frequency temperature characteristic of the SAW resonator is corrected using the temperature characteristic of the propagation delay time of the buffer 2a that constructs the voltage-controlled SAW oscillator 1A.

In the voltage-controlled SAW oscillator 1A shown in FIG. 1, the buffer 2a includes the oscillating differential amplifier 21 and the feedback-buffer differential amplifier 23 connected thereto in series. The propagation delay time of the buffer 2a in this case is the phase delay, expressed as time, of the input signal and the output signal between the input terminal D1 (or D2) of the oscillating differential amplifier 21 and the output terminal Q1 (or Q2) of the feedback-buffer differential amplifier 23.

In describing the method for correcting the frequency temperature characteristic of the SAW resonator, suppose the capacitance value of a capacitor Co constructing the voltage-controlled phase-shift circuit 3, shown in FIG. 3, does not depend on the temperature and, similarly, also the other passive elements do not depend on the temperature. Although the phase shift depending on the capacitance value of a variable capacitance diode Cv has temperature dependence, it is not taken into consideration because it is sufficiently smaller than the phase shift depending on the propagation delay time of the buffer 2a. The description will be given with the SAW resonator X, as the basis, having the frequency temperature characteristic shown in FIG. 7, specifically, having a positive frequency deviation in a temperature range of 25° C. or more and the peak temperature in a high-temperature range.

Figure 8A:
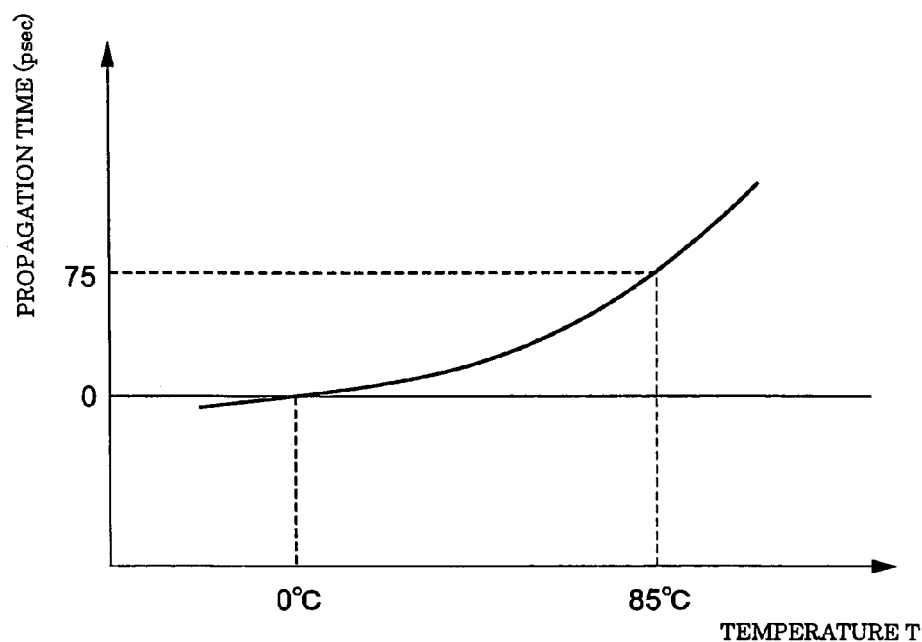
Figure 8B:
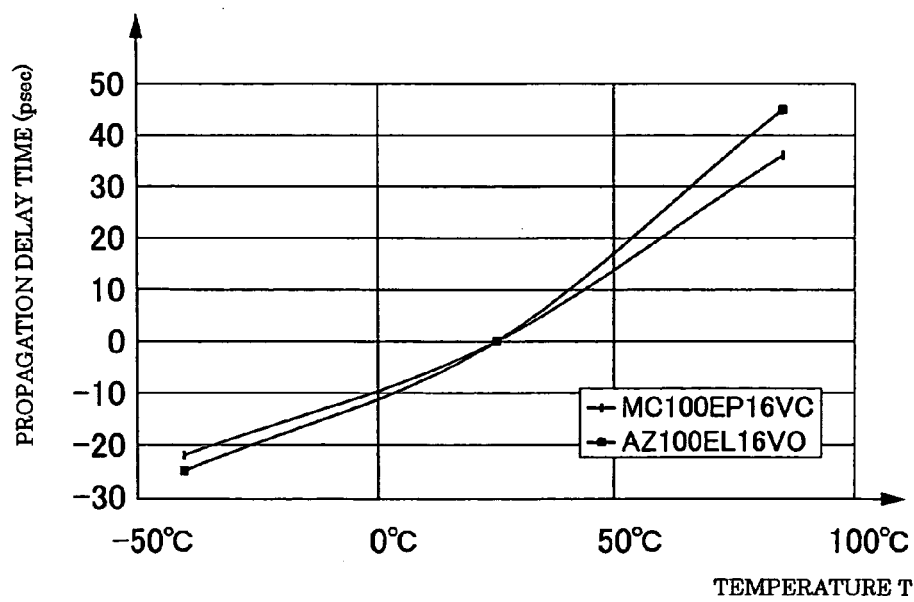
FIG. 8(b) is a correlation diagram of the propagation delay time and the temperature characteristic of the buffer 2a as an exiting product.

FIG. 8 shows the temperature characteristic of the buffer 2a, wherein FIG. 8(a) shows the correlation between the propagation delay time and the temperature characteristic of the buffer 2a as an example, and FIG. 8(b) shows the correlation between the propagation delay time and the temperature characteristic of the buffer 2a of an existing product.

Referring to FIG. 8(a), the propagation delay time has a positive temperature characteristic that the delay time increases with increase of temperature.

The phase condition to meet the oscillation condition of the voltage-controlled SAW oscillator 1A is that the phase shift of the feedback circuit is 360 degrees. Specifically, even when the ambient temperature becomes high and so the propagation delay time at that time becomes larger than at a normal temperature (25° C.), the phase condition for oscillation remains 360° C. Accordingly, when the phase delay between the oscillating differential amplifier 21 and the feedback-buffer differential amplifier 23 increases, a resonance frequency f decreases so that the phase shift corresponds to the propagation delay time responding to the cycle of the frequency of the SAW resonator X.

Figure 9:
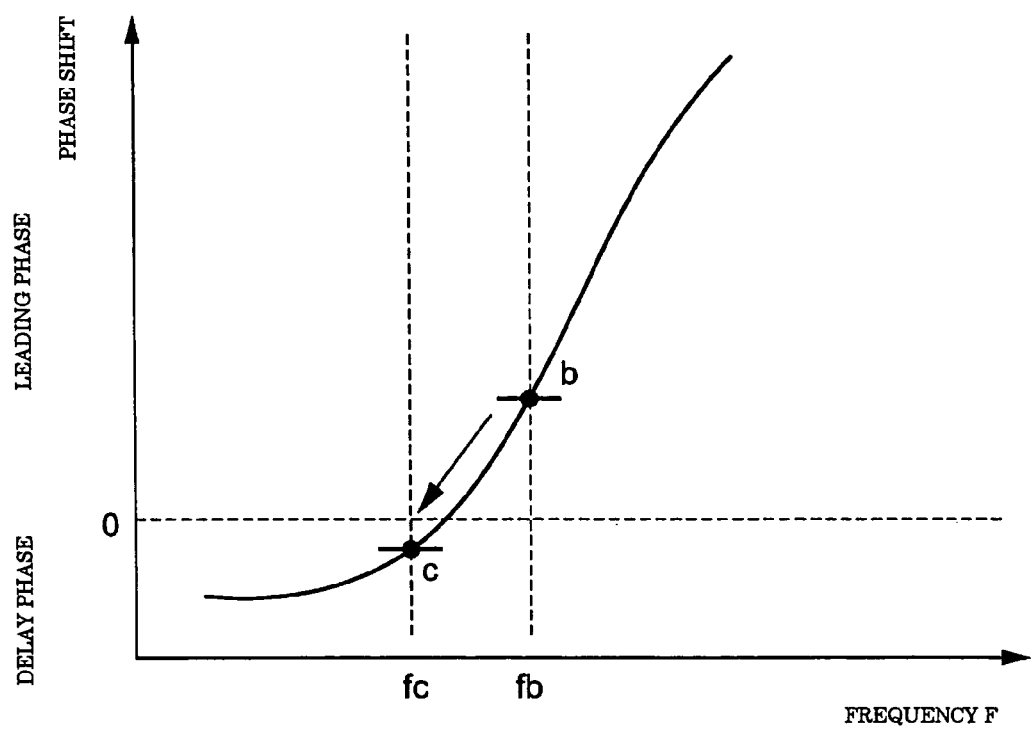
FIG. 9 is a graph of an example of the frequency temperature characteristic of the SAW resonator.

FIG. 9 is shows the phase-vs.-frequency characteristic of the SAW resonator X.

Figure 7:
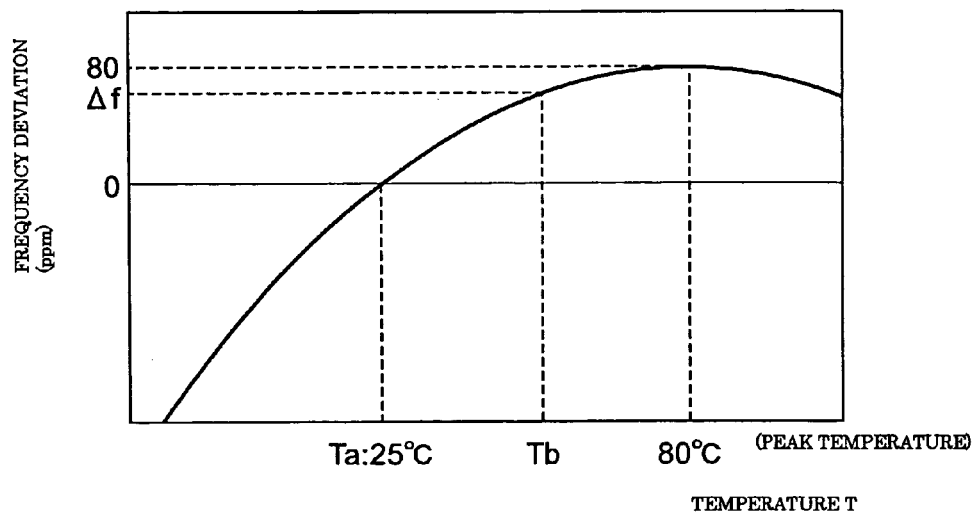
FIG. 7 is a characteristic graph of the temperature characteristic of the propagation delay time of a buffer.

Suppose the ambient temperature shifts from a normal temperature (25° C.) Ta to a high temperature Tb and a resonance frequency fa of the SAW resonator X at the normal temperature changes to a high frequency fb (=fa+Δf), as shown in FIG. 7. The change to the resonance frequency fb is corrected with the delay shift corresponding to the propagation delay time to shift the phase from point b to point c on the phase-vs.-frequency characteristic graph shown in FIG. 9 to decrease the phase shift, so that the frequency shifts to a resonance frequency fc of the SAW resonator. In other words, the increase in the resonance frequency of the SAW resonator X due to the shift of the ambient temperature to high temperature is corrected with the propagation delay time of the buffer 2a, so that the resonance frequency of the SAW resonator X is decreased.

FIG. 8(b) shows the correlation between the propagation delay time and the temperature characteristic of the buffers 2a randomly sampled from respective production lots of a product "MC100EP16VC" manufactured by Onsemi Inc. and a product "AZ100EL16V0" manufactured by Arizona Microtec, as existing products. Combining the products with SAW resonators having a frequency temperature characteristic corresponding to the propagation delay time of the production lots of these products allows the correction of the frequency temperature characteristic of the voltage-controlled SAW oscillator 1A.

(4) The NTC thermistor for correcting the frequency temperature characteristic will now be described.

Figure 10:
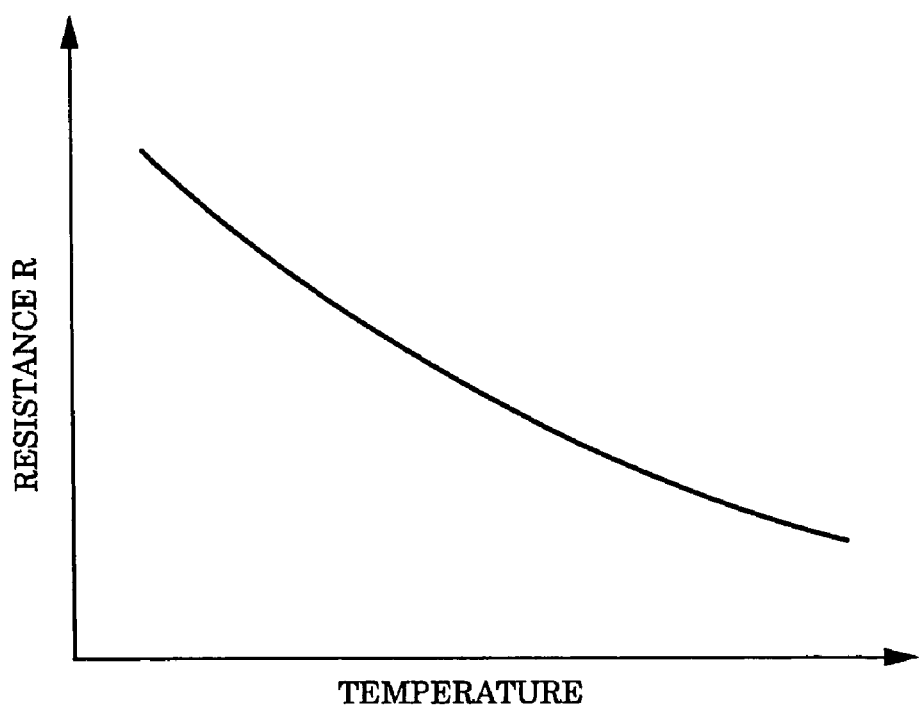
FIG. 10 is a graph of the temperature characteristic of the resistance of an NTC thermistor.

The NTC thermistor (Rt) 5 has a negative temperature characteristic that the resistance decreases with increase of temperature, as shown by the temperature characteristic of the resistance R in FIG. 10. In this drawing, the vertical axis (resistance R) is of a logarithmic scale.

Figure 11:
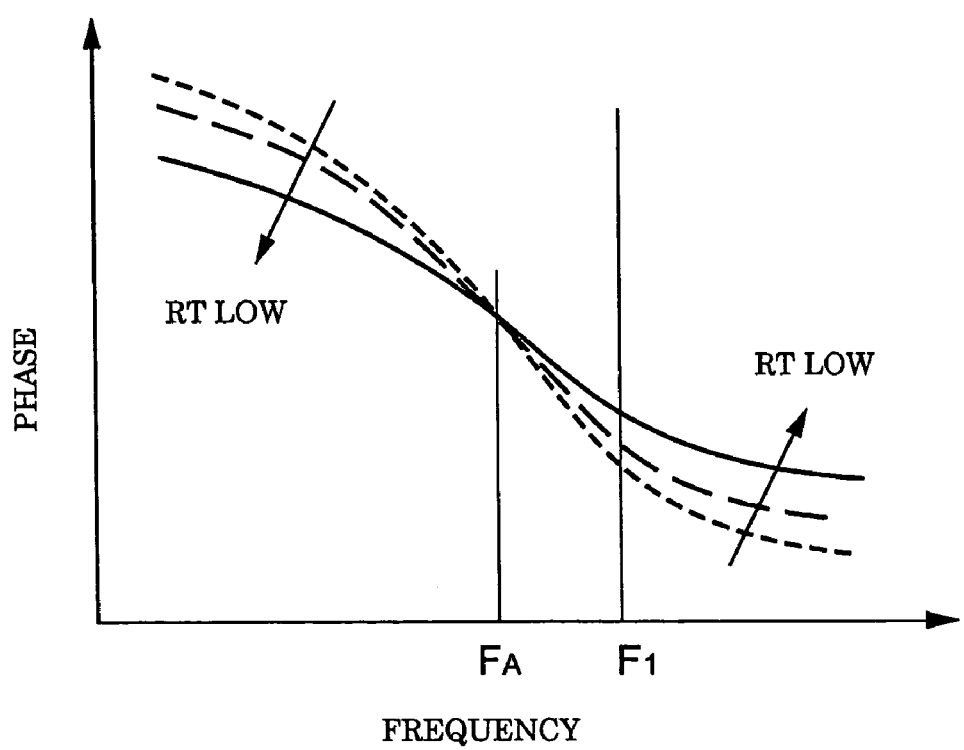
FIG. 11 is a graph of frequency-vs.-transmission-phase characteristic of a tank circuit when the NTC thermistor is connected in parallel.

FIG. 11 shows the frequency-vs.-transmission-phase characteristics when the resistance R of the NTC thermistor (Rt) 5 of the impedance circuit (Zd) 4 is varied. As shown by the arrow in the drawing, the lower the resistance R, the more the frequency-vs.-transmission-phase characteristic changes to such a characteristic that the curve rotates counter-clockwise around a resonance frequency $F_A$ of the impedance circuit (Zd) 4. In other words, the lower the resistance R, the frequency-vs.-transmission-phase characteristic comes close to a flat characteristic, while decreasing the change in phase transmission amount relative to the frequency change.

Figure 12:
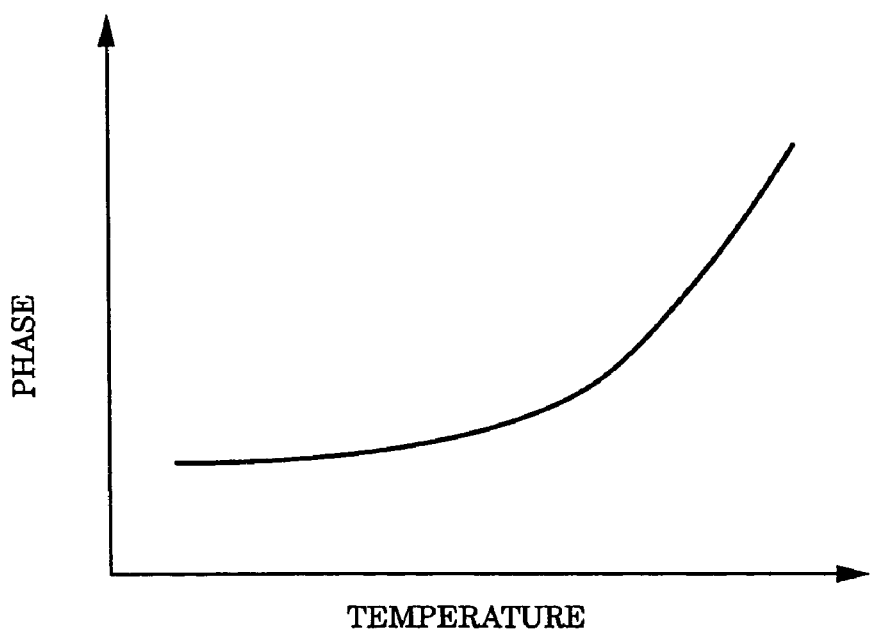
FIG. 12 is a graph of the temperature characteristic of transmission phase of the tank circuit when the NTC thermistor is connected in parallel.

FIG. 12 shows the temperature-vs.-transmission-phase characteristic at an arbitrary frequency $F_1$ (refer to FIG. 11) higher than the resonance frequency $F_A$ of the impedance circuit (Zd) 4. As shown in FIG. 12, the impedance circuit (Zd) 4 has a small amount of transmission-phase change by temperature change when temperature is low, while it has a large amount of transmission-phase change by temperature change when temperature is high. More specifically, the impedance circuit (Zd) 4 has the characteristic that the change amount of the transmission phase is larger at high temperature than at low temperature in the region where the frequency is higher than the resonance frequency $F_A$.

Figure 26:
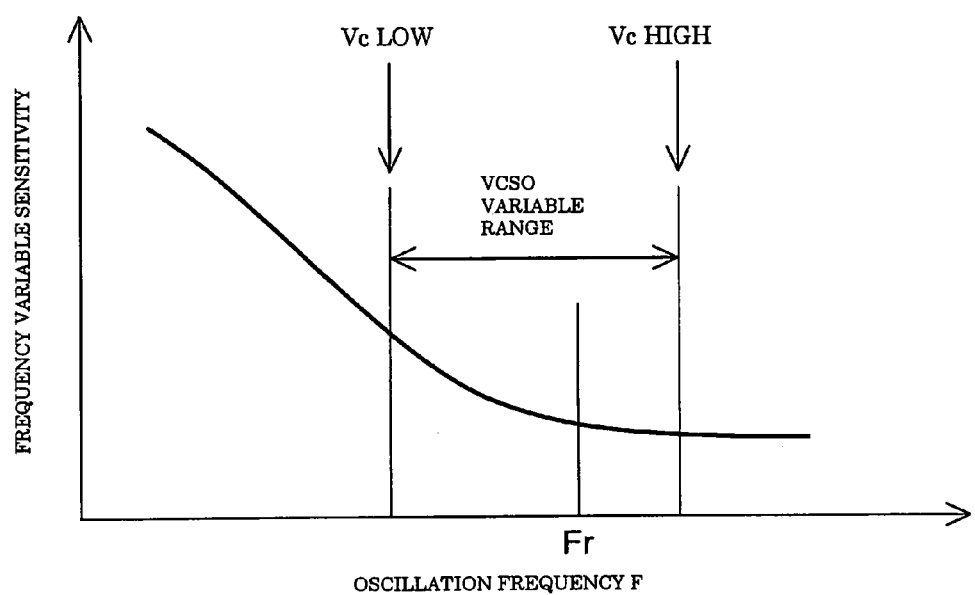
FIG. 26 is a graph of the frequency fluctuation sensitivity against a phase change in a positive-feedback oscillation loop in the conventional voltage-controlled SAW oscillation circuit.

Referring to FIG. 26, the conventional voltage-controlled SAW oscillator has low sensitivity to frequency change in the region where the oscillation frequency F is high, or when the control voltage Vc is high, while it has high sensitivity to frequency change in the region where the oscillation frequency F is low, or when the control voltage Vc is low. On the other hand, with the voltage-controlled SAW oscillator 1A, the change amount of transmission phase in the high-frequency region can be increased by the impedance circuit (Zd) 4, so that the sensitivity to frequency change can be increased even when the oscillation frequency F is high.

Figure 13:
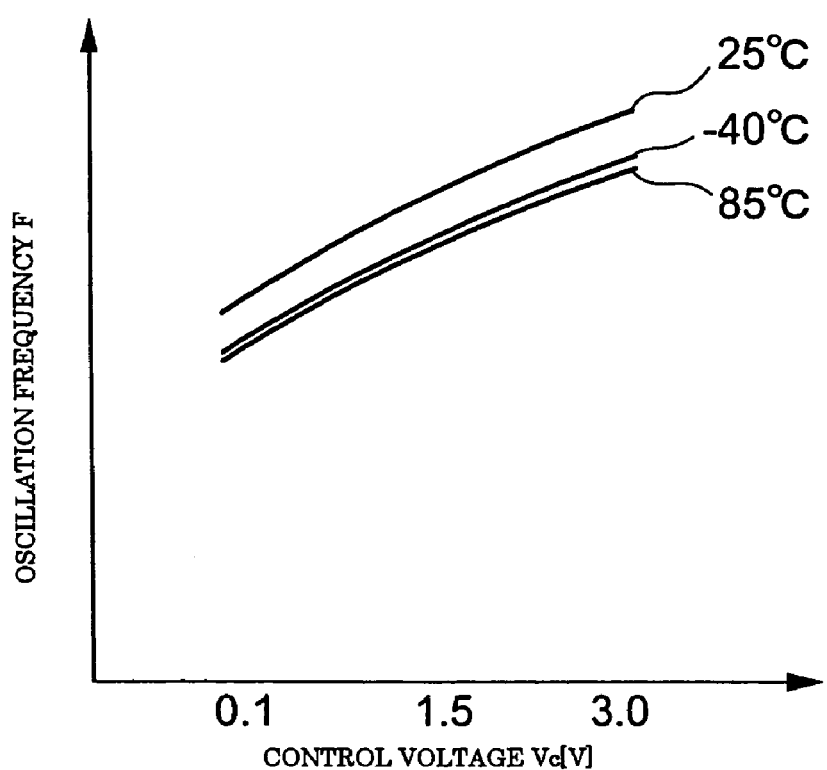
FIG. 13 is graph of a control voltage-vs.-oscillation frequency when temperature is varied in the voltage-controlled SAW oscillator.
Figure 14:
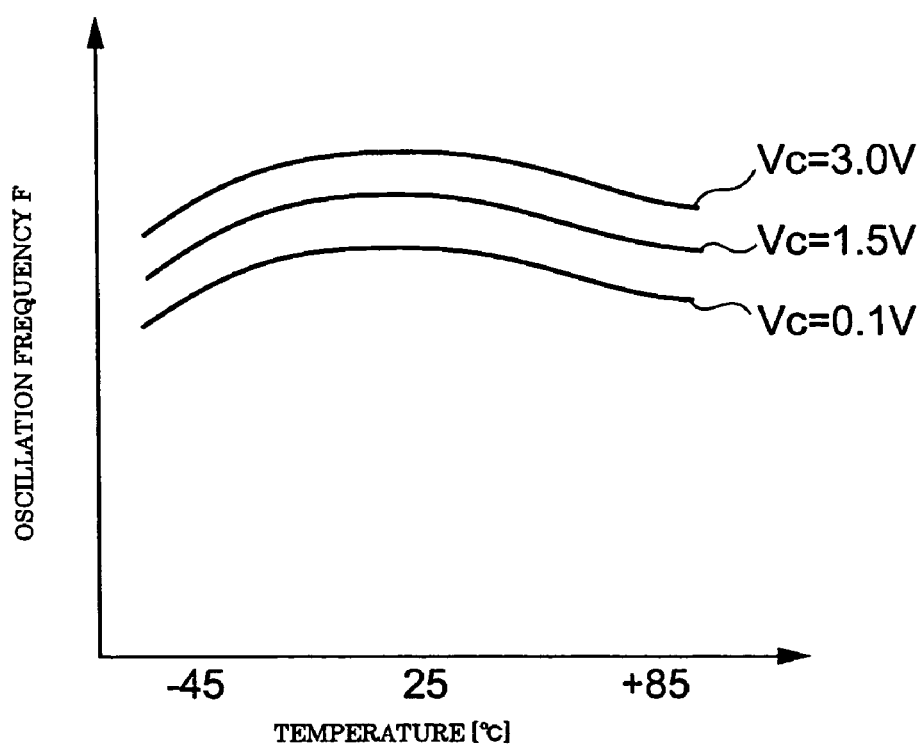
FIG. 14 is a graph of the temperature characteristic of the oscillation frequency of the voltage-controlled SAW oscillator.
Figure 27:
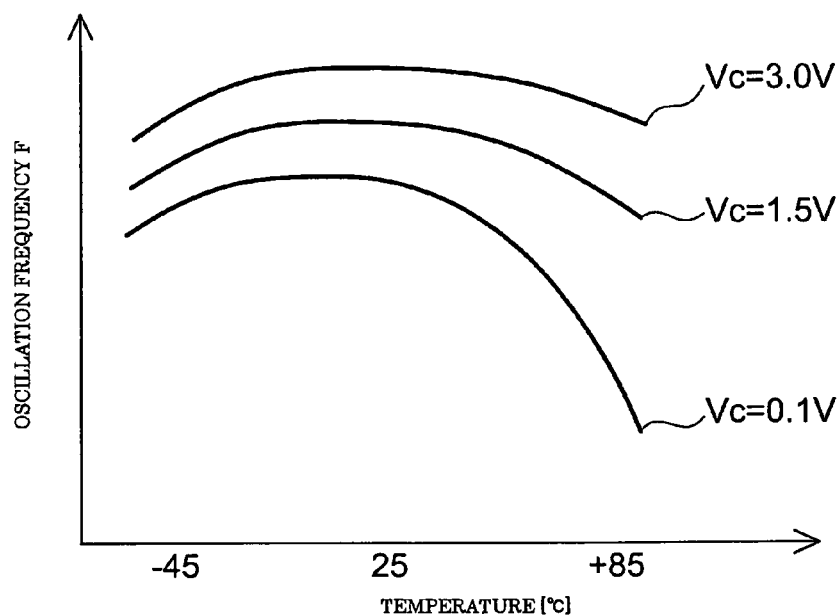
FIG. 27 is a graph of the temperature characteristic of an oscillation frequency F of the conventional the voltage-controlled SAW oscillation circuit.

Accordingly, as shown by the control voltage Vc-vs.-oscillation-frequency F characteristic of the voltage-controlled SAW oscillator 1A in FIG. 13, the voltage-controlled SAW oscillator 1A can have the sensitivity to frequency change, relative to the control voltage Vc, almost equal to that in the other temperature range even at high temperature. As described above, when the temperature and the control voltage Vc are constant, the smaller the resistance R of the NTC thermistor (Rt) 5 is, the smaller the change in phase transmission amount, relative to the frequency change, can be (refer to FIG. 11). Thus, the temperature change of the oscillation frequency F can be reduced in a wide temperature range, as shown by the temperature characteristic of the oscillation frequency F of the voltage-controlled SAW oscillator 1A in FIG. 14. Particularly, the temperature change of the oscillation frequency in a high temperature range can be significantly reduced as compared with the conventional temperature characteristic shown in FIG. 27.

As is apparent from the above description, since the voltage-controlled SAW oscillator 1A according to the invention uses the impedance circuit (Zd) 4 having the NTC thermistor (Rt) 5 connected in parallel, the control voltage Vc-oscillation frequency F characteristic in a wide temperature range, particularly, in a high temperature range can be improved and also the temperature change of the oscillation frequency F can be reduced.

The embodiment has at least the following advantages, as described above in detail.

(1) The SAW resonator of this embodiment is improved in a frequency temperature characteristic in the entire temperature range as compared with the conventional SAW resonators, as shown in FIG. 6. For example, it is apparent that the frequency temperature characteristic of the SAW resonator at −5° C. has been improved to approximately a half of that of the conventional SAW resonator.

Figure 15:
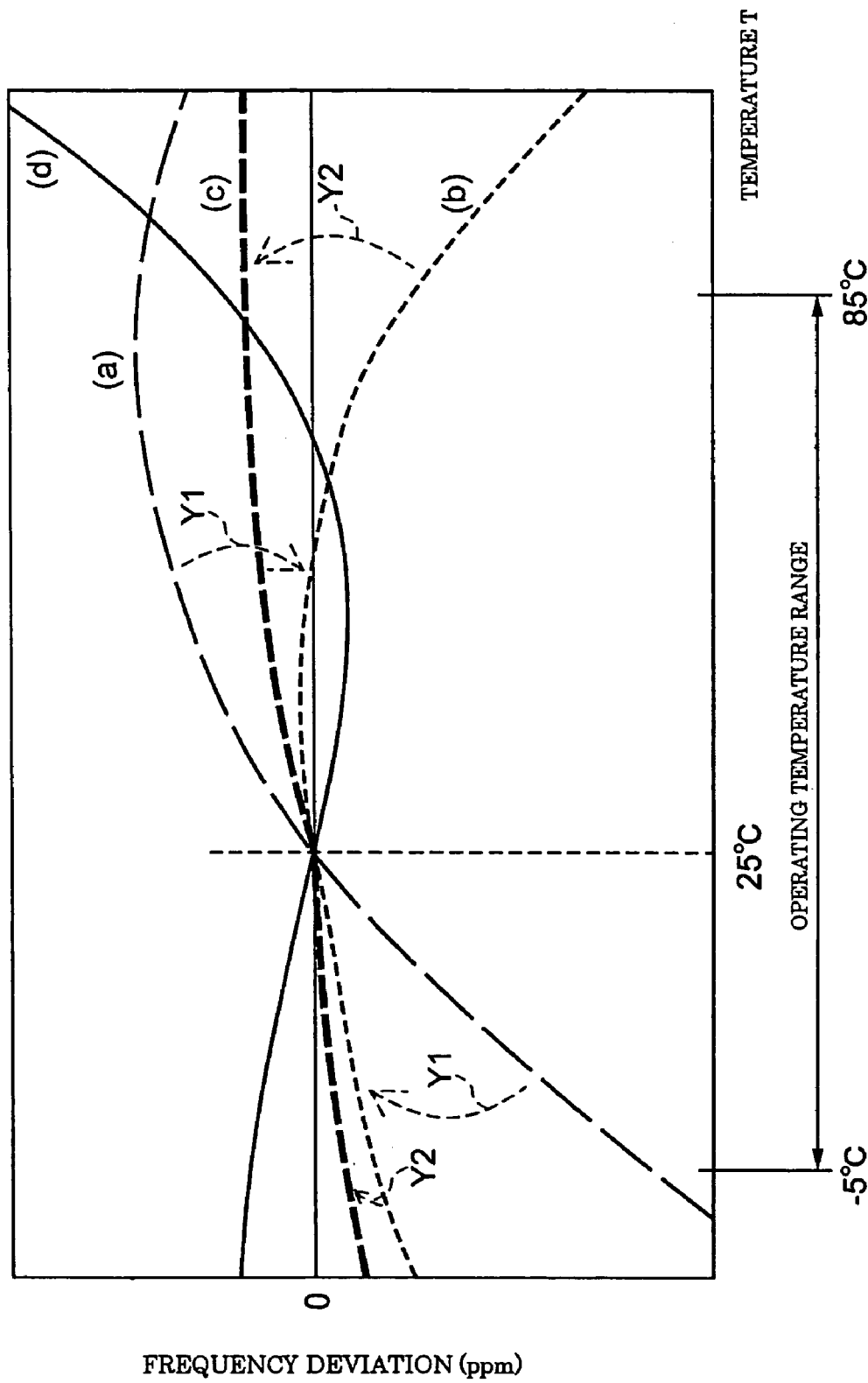
FIG. 15 is a graph of the frequency temperature characteristic of the SAW resonator corrected with the temperature characteristic of the propagation delay time of the buffer.

FIG. 15 shows the graph of the frequency temperature characteristic of the SAW resonator corrected with the propagation delay time of the buffer 2a. Specifically, FIG. 15 shows the relationship between the frequency temperature characteristic curve (a) of the SAW resonator, shown in FIG. 9, and the frequency temperature characteristic curve (b) of the SAW resonator corrected by using the temperature characteristic of the propagation delay time, described in FIG. 7. The use of the temperature characteristic of the propagation delay time gives the characteristic curve (b) of the SAW resonator, corrected by rotating the frequency temperature characteristic curve (a) of the SAW resonator by a specified amount in the direction shown by the arrow Y1. The use of the temperature characteristic of the NTC thermistor gives the characteristic curve (c) of the SAW resonator, corrected by improving the temperature change of the frequency variable characteristic curve (b) in the direction shown by the arrow Y2. The curve (d) of FIG. 15 shows the frequency temperature characteristic of the AT quartz crystal resonator. As clearly shown in FIG. 15, the characteristic curve (a) of the SAW-resonator can be corrected to almost an equal level to that of the AT quartz crystal resonator in the operating temperature range.

The voltage-controlled SAW oscillator according to the embodiment uses a SAW resonator, improved in a frequency temperature characteristic, as means for compensating the frequency temperature characteristic and also uses the temperature characteristic of the propagation delay time of the buffer, constructed of differential amplifiers. FIG. 16 shows a graph of an example of the temperature characteristic of the oscillation frequency of the voltage-controlled SAW oscillator. The use of the temperature characteristic of the propagation delay time reduces the temperature change of the oscillation frequency F in a wide temperature range, as shown in FIG. 16. This offers the advantage of providing the frequency temperature characteristic at almost the same level as that of the conventional AT quartz crystal resonator, shown in FIG. 25.

(2) The frequency temperature characteristic at almost the same level as that of the conventional AT quartz crystal resonator is ensured and a necessary frequency variable range can be reduced, so that the control voltage width of the voltage-controlled phase-shift circuit can also be reduced. This provides the advantage of easily compensating the frequency variable range necessary for meeting the system specifications even with low supply voltage.

(3) Since the temperature characteristic of the propagation delay time of the amplifier is used to further correct the frequency temperature characteristic of the SAW resonator, there is no need to provide an additional dedicated temperature compensation circuit. This offers the advantage of reducing the size of the oscillation circuit, thus achieving the micro-miniaturization and low price of the voltage-controlled oscillator.

(4) The use of the SAW resonator allows a desired high-frequency oscillation signal to be directly provided, eliminating the necessity for a multiplexer circuit, thereby achieving the micro-miniaturization and low price of the voltage-controlled oscillator.

Since the SAW resonator produces no secondary vibration, as in the AT quartz crystal resonator, it does not couple with the principal vibration and no unnecessary unwanted mode occurs. Since there is no need for a multiplexer circuit for multiplying the frequency, no harmonic wave generates. This offers the advantage of achieving a voltage-controlled oscillator without jitter caused by the secondary vibrations, an unnecessary unwanted mode, and harmonic waves.

Since the feedback-buffer differential amplifier includes a plurality of output terminals, the output signal for the positive-feedback oscillation loop is outputted from one terminal, while the other dead output terminals can be used as the output for the feedback-loop output signal of a later-described clock converter.

SECOND EMBODIMENT

A second embodiment will now be described.

Figure 17:
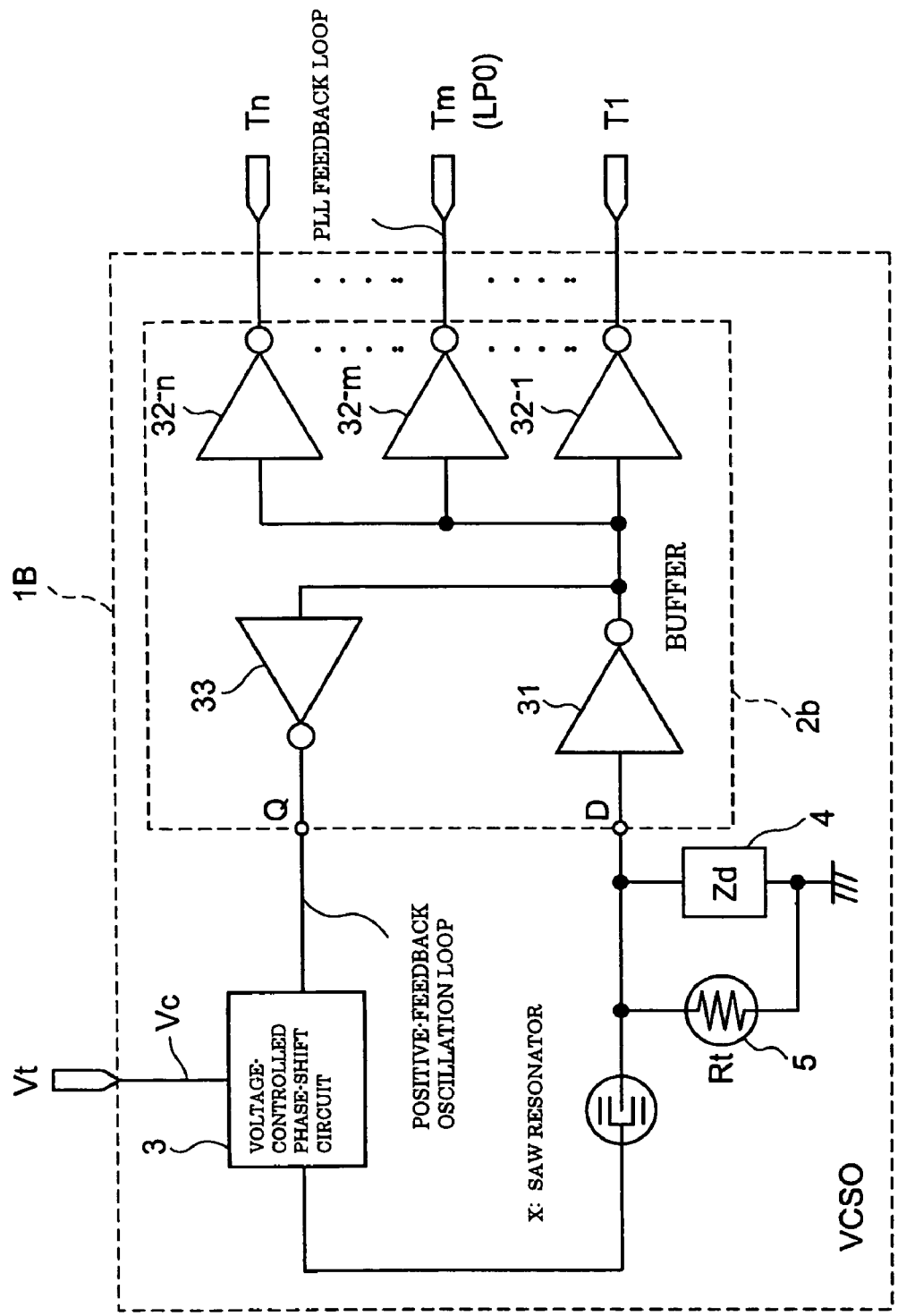
FIG. 17 is a block diagram of a voltage-controlled SAW oscillator according to a second embodiment.

FIG. 17 is a block diagram of a voltage-controlled SAW oscillator (VCSO) 1B according to the second embodiment.

The difference from FIG. 1 is to use an amplifier having a single input/output in place of the differential amplifier.

More specifically, a plurality of amplifiers 32-1 to 32-n and 33 are connected to the output of an oscillating amplifier 31 in parallel, and used as the feedback buffer amplifier 33 forming a positive-feedback oscillation loop and the output amplifiers 32-1 to 32-n being used to output signals to the outside.

Referring to FIG. 17, a buffer 2b uses the amplifiers 31, 32-1 to 32-n, and 33 each having a single input/output in place of the differential amplifiers shown in FIG. 1. The plurality of amplifiers 32-1 to 32-n and the feedback buffer amplifier (second amplifier) 32 are connected to the output stage of the oscillating amplifier (first amplifier) 31 in parallel. The oscillating amplifier 31, the feedback buffer amplifier 33, the voltage-controlled phase-shift circuit 3, and the SAW resonator X construct a positive-feedback oscillation loop. An amplifier 32-m (m=1 to n) of the plurality of amplifiers (third amplifiers) 32-1 to 32-n constructs a feedback loop and the other amplifiers 32-1 to 32-n except the amplifier 32-m construct output amplifiers for outputting clock signals to the outside.

The propagation delay time of the buffer 2b in this case is the phase delay, expressed as time for the voltage-controlled SAW oscillator (VCSO) 1B, between the oscillating amplifier 31 and the feedback buffer amplifier 33 connected thereto in series, as in the first embodiment. Since other points except that are the same as the first embodiment, the same blocks are given the same reference numerals and their detailed description will be omitted.

The embodiment offers at least the following advantages, as described above in detail.

In addition to the advantages of the first embodiment, at least the following advantages are offered.

According to the embodiment, as shown in FIG. 17, the output of the oscillating amplifier 31 constructed of a single type amplifier is branched by a plurality of output amplifiers provided in the buffer 2b. A feedback-loop output signal is outputted from one of the output amplifiers and clock signals are outputted from the plurality of output amplifiers except the one output amplifier. This kind of output offers the advantage that there is no need to add another buffer circuit to the outside of the voltage-controlled oscillator.

When a buffer circuit is arranged outside the buffer as in the conventional voltage-controlled SAW oscillator, the wire connecting between the output amplifier for outputting a clock signal and the external buffer circuit may cause the respective signals to interfere with each other. Also a phase difference may generate between the feedback-loop output signal from the buffer and the clock signal outputted from the buffer circuit. In those cases, according to the embodiment, the output signal from the oscillating amplifier 31 can be distributed to the plurality of amplifiers inside the buffer. Accordingly, no phase difference generates between the clock signal outputted from the output amplifier, the signal outputted from the feedback buffer amplifier 33, and, for example, the output signal used for a later-described clock converter feedback loop.

THIRD EMBODIMENT

A third embodiment will now be described.

FIG. 18 is a block diagram of a clock converter according to the third embodiment.

In this embodiment, a clock converter incorporating the voltage-controlled SAW oscillator 1A described in the first embodiment will be described. The clock converter is characterized in that the feedback-loop output terminal LP0 of the voltage-controlled SAW oscillator 1A using the SAW resonator X, improved in a frequency temperature characteristic, is used to form a feedback loop. More specifically, any of the plurality of output signals of the feedback-buffer differential amplifier 23 constructing the voltage-controlled SAW oscillator 1A, shown in FIG. 1, is used as a feedback-loop output signal.

A clock converter 50a shown in FIG. 18 includes a phase comparing section 55, a loop filter (LPF) 53, and the voltage-controlled SAW oscillator 1A. The phase comparing section 55 includes an input frequency divider circuit (division ratio: 1/P) 51, a phase comparator circuit (PD) 52, and a feedback frequency divider circuit (division ratio: 1/N) 54. The phase comparing section 55 is generally constructed as an integrated circuit (IC).

With such a structure, a clock signal F1 inputted to the clock converter 50a at 155.52 MHz, for example, is converted to a clock signal F2 of 622.08 MHz and is outputted.

The voltage-controlled SAW oscillator 1A uses the SAW resonator described in the first embodiment. An output signal from the output terminal Q1 of the feedback-buffer differential amplifier 23 of the voltage-controlled SAW oscillator 1A is used as a feedback-loop output signal S of the clock converter 50a. As compared with the case in which the output signal from the conventional voltage-controlled SAW oscillator is used, this eliminates the interaction with a load circuit (not shown) connected thereto.

The loop filter 53 feeds the control voltage Vc to the voltage-controlled phase-shift circuit 3 of the voltage-controlled SAW oscillator 1A while removing the noise generated by the differential operation of the phase comparator circuit 52 (smoothing the phase difference signal). The input frequency divider circuit (division ratio: 1/P) 51 is a divider for dividing the input clock signal and inputting it to the phase comparator circuit 52. The feedback frequency divider circuit (division ratio: 1/N) 54 is a divider for dividing the feedback-loop output signal S from the feedback-loop output terminal LP0 and feeding it to the phase comparator circuit 52.

Figure 19:
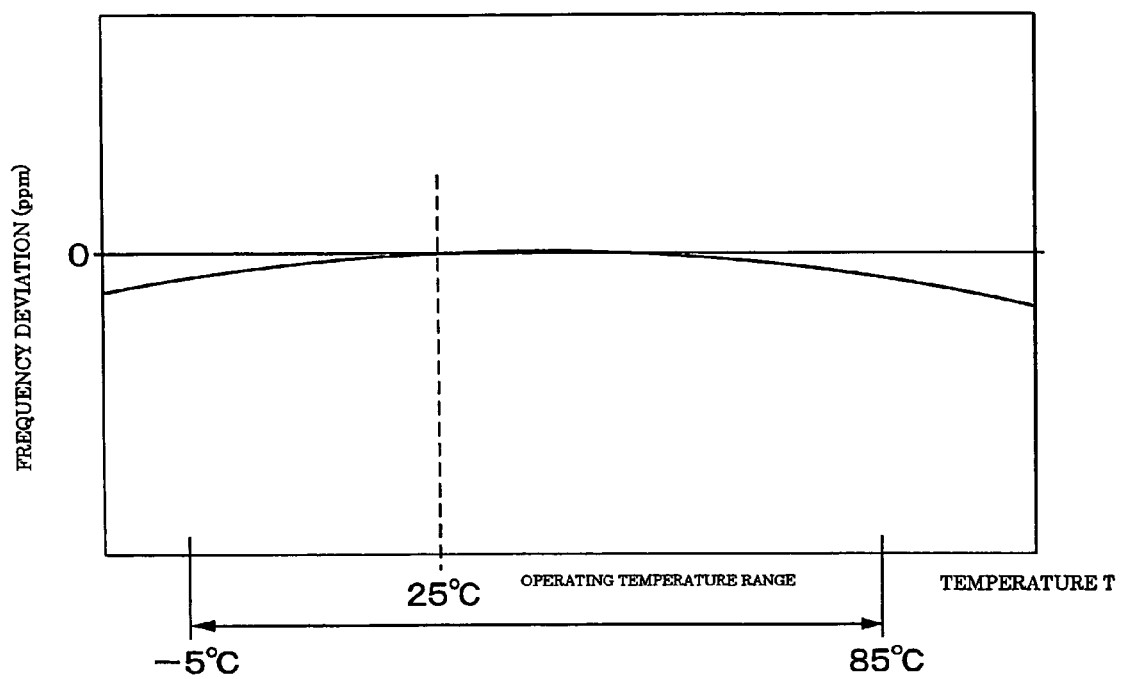
FIG. 19 is a graph of an example of the temperature characteristic of the oscillation frequency of the clock converter incorporating the voltage-controlled SAW oscillator.

As described above in detail, the embodiment offers at least the following advantages:

(1) The clock converter 50a of this embodiment uses the SAW resonator X, improved in a frequency temperature characteristic, and includes the voltage-controlled SAW oscillator 1A, in which the frequency temperature characteristic of the SAW resonator X is corrected. FIG. 19 shows a graph of an example of the temperature characteristic of the oscillation frequency of the clock converter incorporating the voltage-controlled SAW oscillator. As shown in FIG. 19, the temperature change of the oscillation frequency F can be reduced in a wide temperature range. This ensures the frequency temperature characteristic at the same level as that using the conventional AT quartz crystal resonator, shown in FIG. 25, thus offering the advantage of meeting the system accuracy required by a market with a narrow control voltage width for the voltage-controlled SAW oscillator 1A.

(2) The frequency variable range with the conventional control voltage width ensures a large margin, thus providing the advantage of facilitating responding to the specification change of increasing the system accuracy from the system.

(3) Since the frequency variable range of the voltage-controlled SAW oscillator 1A can be controlled with a narrow control voltage width, the loop filter 53 generating the control voltage can easily be constructed. In addition, since the frequency can be controlled with a narrow control voltage width, a necessary frequency variable range can easily be compensated even at a low supply voltage, and the frequency deviation of the converted clock signal can be maintained at highly accurate.

(4) Since the voltage-controlled SAW oscillator 1A is used, in which jitter is reduced significantly and no dedicated temperature compensating circuit is required, the clock converter 50a with little jitter, caused by itself, can be provided, in which micro-miniaturization and low price are achieved.

(5) The clock converter 50a of this embodiment forms a feedback loop using the feedback-loop output terminal LP0 of the voltage-controlled SAW oscillator 1A. More specifically, since the feedback-buffer differential amplifier 23 described in the first embodiment includes a plurality of output terminals, the dead output terminal Q1 can be used as the output for the feedback-loop output signal SQ1. The feedback-loop output signal SQ1 outputted to the outside provides the advantage of directly connecting to the external circuit without connecting an external buffer circuit.

(6) The use of the feedback-loop output terminal LP0 eliminates the need for the external buffer circuit for the output of the voltage-controlled SAW oscillator, as in the conventional ones, thus offering the advantage of achieving micro-miniaturization and low price of the clock converter 50a.

(7) Even when the voltage-controlled SAW oscillator 1A used for the clock converter 50a is replaced with the voltage-controlled SAW oscillator 1B using a single type amplifier according to the second embodiment, at least the advantages described above are offered.

FOURTH EMBODIMENT

A fourth embodiment will now be described.

This embodiment will describe an electronic device applying the clock converter according to the third embodiment.

The clock converter of this embodiment can also be applied to electronic devices such as an optical transceiver module of a 10-Gbit/s optical interface.

Figure 20:
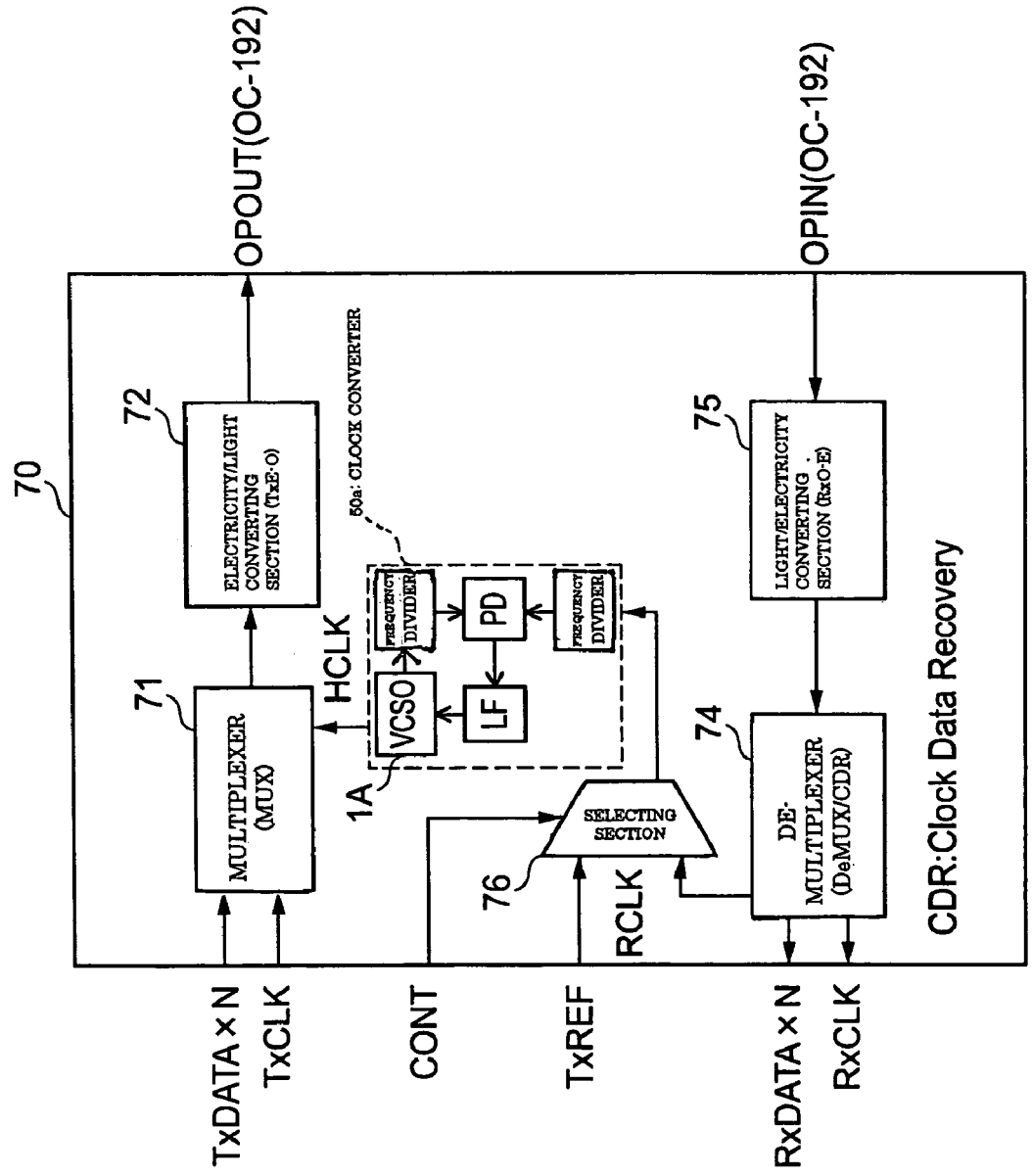
FIG. 20 is a block diagram of a 10-Gbit/s optical transceiver module incorporating the clock converter of according to the third embodiment in a fourth embodiment.

FIG. 20 is a block diagram of a 10-Gbit/s optical transceiver module for the optical interface incorporating the clock converter of the third embodiment. The optical transceiver module 70 for optical networks achieves an interface function for light/electricity conversion and electricity/light conversion and multiplexing and de-multiplexing, for example, between a server computer and an optical network. The optical transceiver module 70 feeds a high-frequency clock signal generated by the clock converter 50a as a reference clock signal of a multiplexer (MUX) 71.

The blocks have the following functions: The multiplexer 71 multiplexes a plurality of transmission slow data (TxDATA×N) received from a lower system, where N is an integer, for example, N=16. An electricity/light converting section (TxE-O) 72 converts an electrical signal to an optical signal (OPOUT) and sends it to an optical transmission channel. A light/electricity converting section (RxO-E) 75 converts an optical signal (OPIN) received through an optical transmission channel to an electrical signal. A de-multiplexer (DeMUX/CDR) 74 de-multiplexes the received data, converted to the electrical signal by the light/electricity converting section 75, into a plurality of reception low data (RxDATA×N). The clock converter 50a converts a low-frequency clock signal to a high-frequency reference clock signal and feeds it to the multiplexer 71. A selecting section 76 selects either a low-frequency external clock signal (TxREF) or a clock signal RCLK from the de-multiplexer 74 and feeds it to the clock converter 50a.

The operation of the optical transceiver module 70 will now be described. The clock converter 50a converts the low-frequency external clock signal (TxREF) selected by the selecting section 76 to a high-frequency clock signal HCLK. For example, when the selecting section 76 selects a low-frequency external clock signal (TxREF) of 64 KHz to 155.52 MHz and feeds it to the clock converter 50a, the clock converter 50a converts it to a high-frequency clock signal HCLK of 622.08 MHz in a 600-MHz band and feeds it to the multiplexer 71. In this way, the 622.08-MHz electrical signal is converted to an optical signal (OPOUT) by the electricity/light converting section 72 and is sent to the optical transmission channel.

Figure 21:
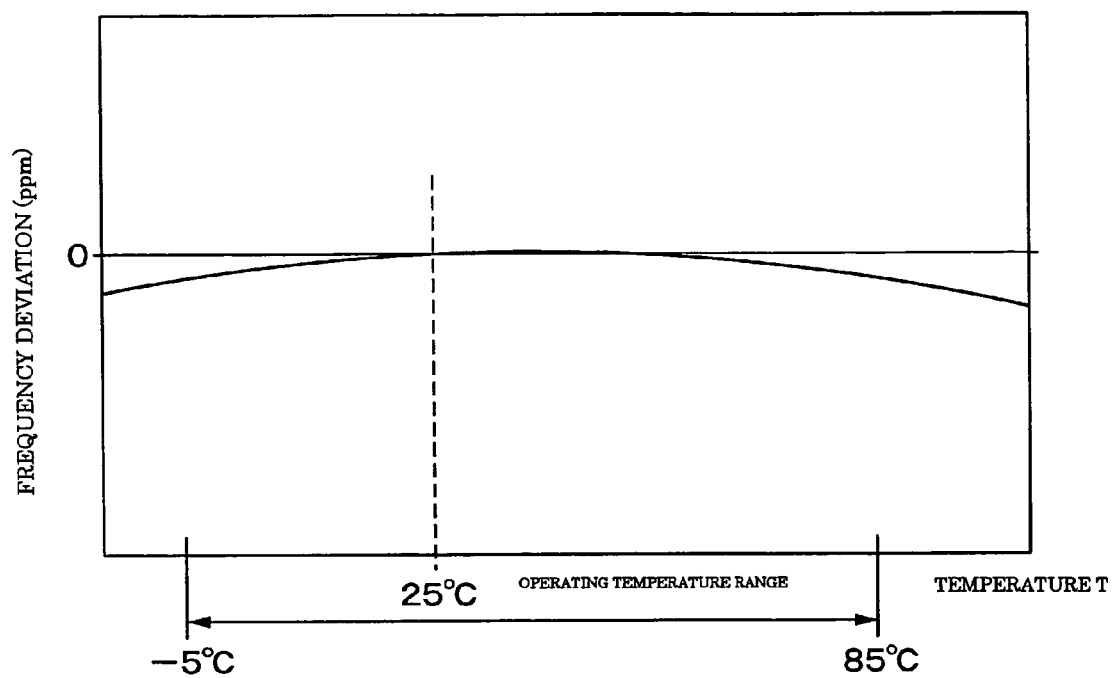
FIG. 21 is a graph of an example of the temperature characteristic of the oscillation frequency of the 10-Gbit/s optical transceiver module incorporating the clock converter of the third embodiment.
Figure 22:
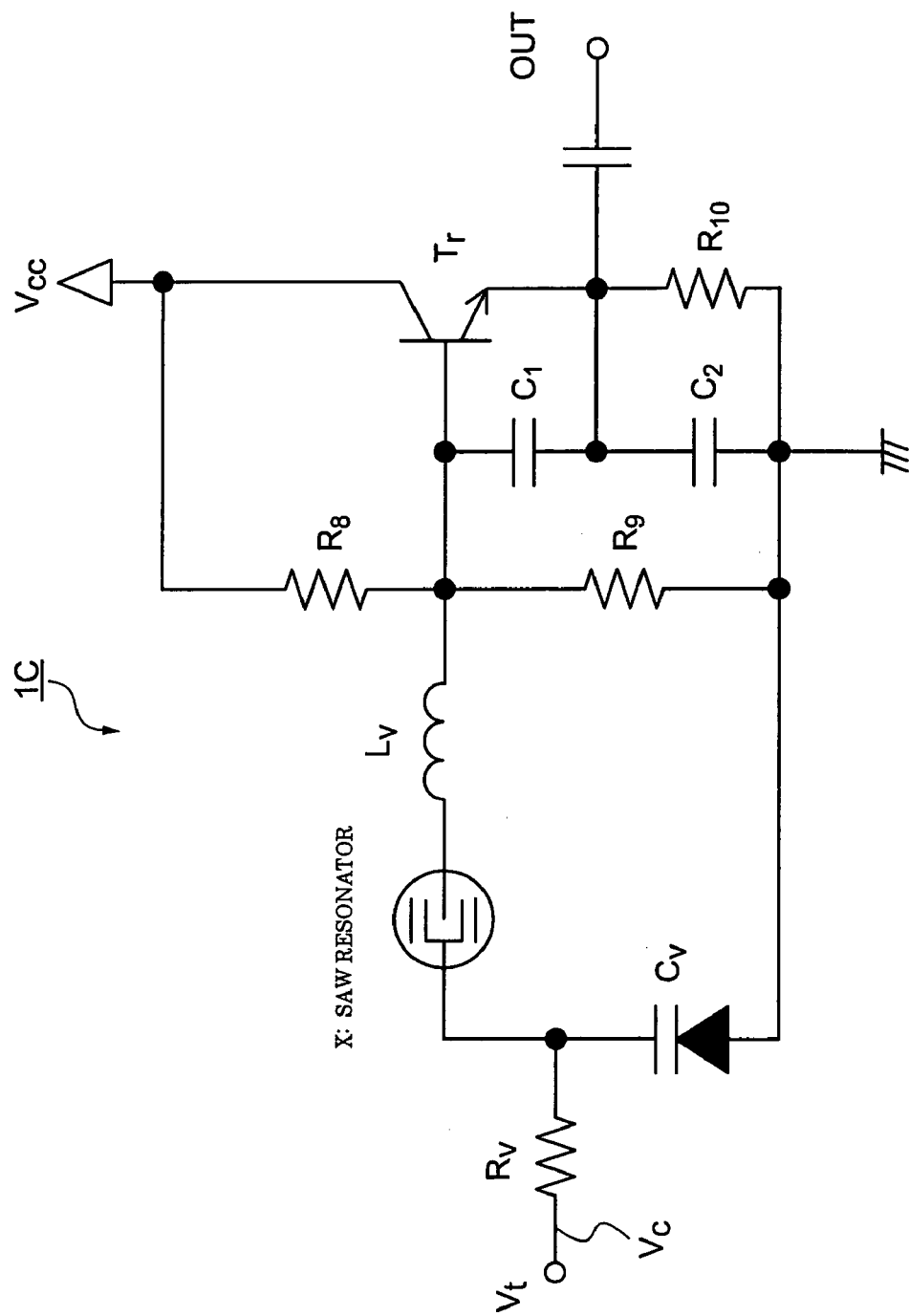
FIG. 22 is a circuit diagram of a conventional general Colpitts voltage-controlled oscillator.
Figure 23:
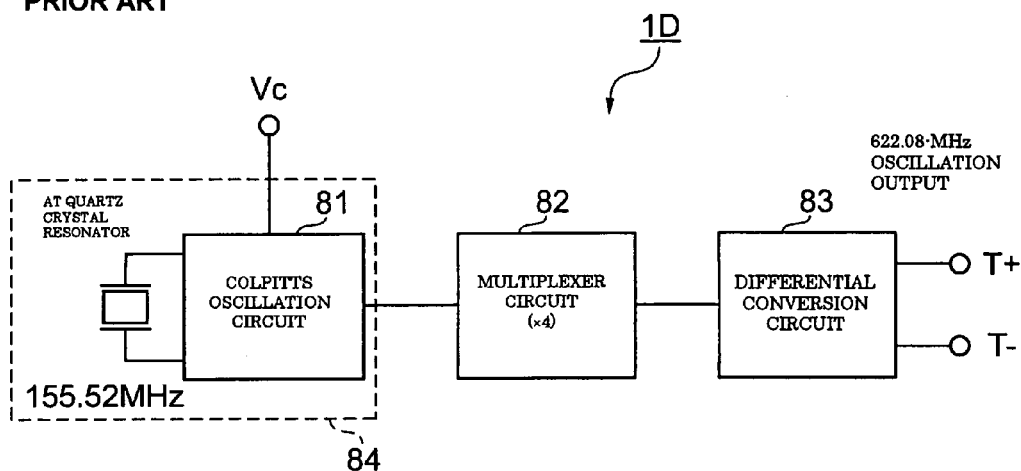
FIG. 23 is a block diagram of a conventional general voltage-controlled quartz crystal oscillator.
Figure 24:
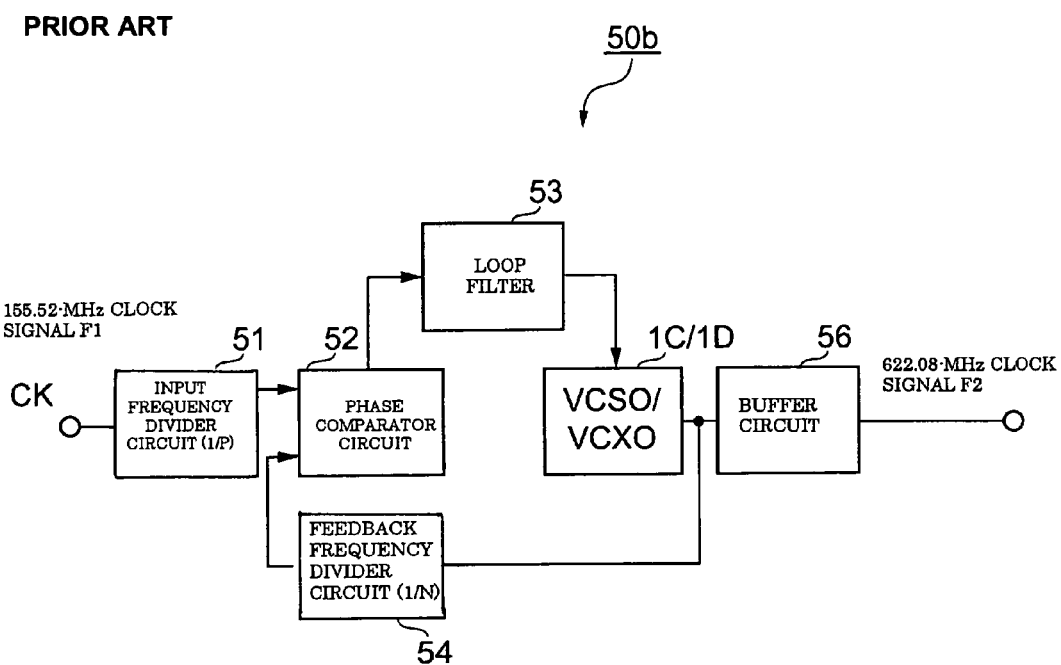
FIG. 24 is a block diagram of a general clock converter using a conventional voltage-controlled oscillator.

The de-multiplexer 74 extracts a high-frequency clock signal RCLK from the data of the optical signal (OPIN), received from the light/electricity converting section 75, with a clock and data recovery (CDR) function. When the selecting section 76 selects the extracted clock signal RCLK, the clock converter 50a reduces the jitter in the clock signal RCLK containing a large amount of jitter and the high-frequency clock signal HCLK with little jitter is sent to the multiplexer 71. FIG. 21 shows a graph of an example of the temperature characteristic of the oscillation frequency of the 10-Gbit/s optical transceiver module incorporating the clock converter of the third embodiment. As a result of using the temperature characteristic of the propagation delay time, the temperature change of the oscillation frequency F can be reduced in a wide temperature range, as shown in FIG. 21.

Figure 25:
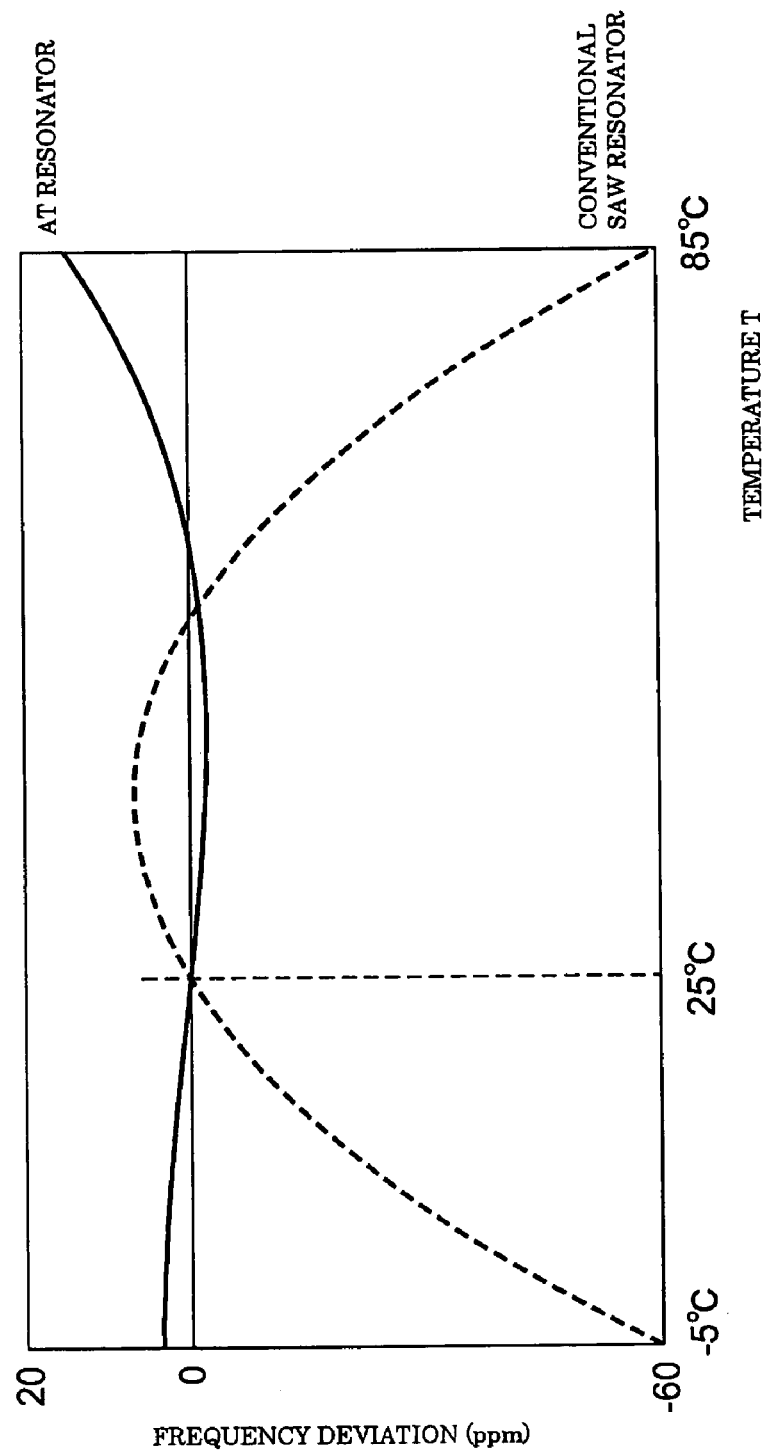
FIG. 25 is a graph of the frequency temperature characteristics of an AT quartz crystal resonator and a conventional SAW resonator.

As described above, the optical transceiver module 70 uses the clock converter 50a incorporating the voltage-controlled SAW oscillator 1A that ensures the frequency temperature characteristic at the same level as that of the conventional AT quartz crystal resonator shown in FIG. 25.

As described in detail, this embodiment offers at least the following advantages:

(1) The clock converter 50a can maintain high-accuracy frequency deviation of the converted clock signal by compensating the frequency variable range at a narrow control voltage width even when the clock signal RCLK containing a large amount of jitter is inputted. Accordingly, the clock converter 50a can generate the high-frequency clock signal HCLK containing very little jitter and feed it to the multiplexer 71.

Since the clock signal HCLK having little jitter is sent to the multiplexer 71, a timing margin between the transmission slow data (TxDATA×N), multiplexed by the multiplexer 71, and the clock signal HCLK is ensured. This offers the advantages of preventing the malfunction of data transmission of the multiplexer 71 and facilitating a stable operation in the high-speed network system, typified by 10-Gbit/s, capable of transmitting a high volume of data such as moving images.

(2) The embodiment includes the clock converter 50a incorporating a voltage-controlled oscillator that has achieved micro-miniaturization and low price by eliminating the need for a dedicated temperature compensation circuit using the temperature characteristic of the propagation delay time of the amplifier in correcting the frequency temperature characteristic of the SAW resonator X. This provides the advantage of achieving miniaturization and low price of an optical transceiver module.

MODIFICATION

The present invention is not limited to the above-described embodiments and can be made in various modifications. For example, the following modifications may be made.

FIRST MODIFICATION

While the amplifiers according to the embodiments have been described with reference to ones using a bipolar transistor, a MOS transistor, which is a different type of transistor, may be used.

SECOND MODIFICATION

While the voltage-controlled oscillator has been described with a case in which it is applied to the clock converter 50a used in an optical transceiver module for networks, it may be applied to various electronic devices such as radio communication devices including cellular phones that require oscillation circuits, particularly, high-frequency oscillation circuits.

THIRD MODIFICATION

The piezoelectric material, constructing piezoelectric resonators such as a quartz crystal resonator, a ceramic resonator, and a SAW resonator, may be not only quartz crystal but also other piezoelectric materials such as langasite or 4-lithium borate.

FOURTH EMBODIMENT

While the correction of the frequency temperature characteristic described in Paragraph [0099] utilizes the temperature characteristic of the propagation delay time of a buffer, it may be applied not only to the SAW resonator, improved in a frequency temperature characteristic, but also to the conventional SAW resonators.

What is claimed is:

1. A voltage-controlled oscillator, comprising:
   a voltage-controlled phase-shift circuit, outputting an output signal with a phase of an input signal shifted by a specified amount according to an external control voltage;
   a SAW resonator, resonating at a specified resonance frequency, and;
   a buffer, inputting a signal from the SAW resonator and outputting the signal as a clock signal with a specified frequency, and outputting an output signal for a positive-feedback oscillation loop,
   wherein the voltage-control phase-shift circuit, the SAW resonator, and the buffer form the positive-feedback oscillation loop, and a frequency temperature characteristic of the SAW resonator is corrected by rotating the frequency temperature characteristic of the SAW resonator by a specified amount using a temperature characteristic of propagation delay time of the buffer.

2. The voltage-controlled oscillator according to claim 1, wherein the buffer further comprises:
   a first differential amplifier, amplifying a signal from the SAW resonator and outputting the signal;
   a second differential amplifier, inputting the signal outputted from the first differential amplifier, of which either one of a non-inversion output terminal and an inversion output terminal outputs the positive-feedback-oscillation-loop output signal; and
   a third differential amplifier, inputting the signal from the first differential amplifier and outputting the signal as a clock signal with a specified frequency,
   wherein the propagation delay time of the buffer is a propagation delay time between the first differential amplifier and the second differential amplifier connected to the first differential amplifier.

3. The voltage-controlled oscillator according to claim 2, wherein the differential amplifier further comprises a differential amplifier circuit using an ECL line receiver.

4. The voltage-controlled oscillator according to claim 1, wherein the buffer further comprises:
   a first amplifier, amplifying a signal from the SAW resonator and outputting the signal;
   a second amplifier, inputting the signal outputted from the first amplifier and outputting the signal as the positive-feedback-oscillation-loop output signal; and
   at least one third amplifier, inputting the signal outputted from the first amplifier and outputting the signal as a clock signal with a specified frequency,
   wherein the propagation delay time is a propagation delay time between the first amplifier and the second amplifier connected to the first amplifier.

5. The voltage-controlled oscillator according to claim 1, wherein the SAW resonator uses an in-plane rotated ST-cut quartz crystal plate with Euler angles of (0, 113° to 135°, ±(40° to 49°)).

6. The voltage-controlled oscillator according to claim 1, further comprising:
   an impedance circuit, generating a specified potential difference between an non-inversion input terminal and an inversion input terminal of the buffer; and
   an NTC thermistor having a negative temperature characteristic parallel to the impedance circuit, between the non-inversion input terminal of the buffer and the terminal of the SAW resonator adjacent a downstream end of the feedback loop.

7. A clock converter, forming a feedback loop constructed of a voltage-controlled oscillator, in which frequency varies depending on a supplied control voltage and which outputs a feedback-loop output signal, a phase comparing section, comparing phases of the feedback-loop output signal from the voltage-controlled oscillator and an external input signal to output a phase-difference signal, and a loop filter, smoothing a phase difference signal to generate the control voltage, wherein the voltage-controlled oscillator comprises:
   a voltage-controlled phase-shift circuit, outputting an output signal with the phase of an input signal shifted by a specified amount according to the control voltage;
   a SAW resonator, resonating at a specified resonance frequency; and
   a buffer, inputting a signal from the SAW resonator and outputting the signal as a clock signal with a specified frequency, and outputting an output signal for a positive-feedback oscillation loop and the feedback-loop output signal,
   wherein the voltage-controlled phase-shift circuit, the SAW resonator, and the buffer form a positive-feedback oscillation loop, and wherein a frequency temperature characteristic of the SAW resonator is corrected by rotating the frequency temperature characteristic of the SAW resonator by a specified amount using a temperature characteristic of propagation delay time of the buffer.

8. The clock converter according to claim 7, wherein the buffer further comprises:
   a first differential amplifier, amplifying a signal from the SAW resonator and outputting the signal;
   a second differential amplifier, inputting the signal outputted from the first differential amplifier, of which either one of a non-inversion output terminal and an inversion output terminal outputs the feedback-loop output signal and the other output terminal outputs the positive-feedback-oscillation-loop output signal; and
   a third differential amplifier, inputting the signal from the first differential amplifier and outputting the signal as a clock signal with a specified frequency,
   wherein the propagation delay time of the buffer is a propagation delay time between the first differential amplifier and the second differential amplifier connected to the first differential amplifier.

9. The clock converter according to claim 8, wherein the differential amplifier further comprises a differential amplifier circuit using an ECL line receiver.

10. The clock converter according to claim 7, wherein the buffer further comprises:
   a first amplifier, amplifying a signal from the SAW resonator and outputting the signal;
   a second amplifier, inputting the signal outputted from the first amplifier and outputting the signal as an output signal for the positive-feedback oscillation loop; and
   a plurality of third amplifiers, inputting the signal outputted from the first amplifier, outputting at least one clock signal having a specified frequency, and outputting the feedback-loop output signal,
   wherein the propagation delay time is a propagation delay time between the first amplifier and the second amplifier connected to the first amplifier.

11. The clock converter according to claim 7, wherein the SAW resonator uses an in-plane rotated ST-cut quartz crystal plate with Euler angles of (0, 113° to 135°, ±(40° to 49°)).

12. The clock converter according to claim 7, further comprising:
   an impedance circuit, generating a specified potential difference between a non-inversion input terminal and an inversion input terminal of the buffer; and
   an NTC thermistor having a negative temperature characteristic parallel to the impedance circuit, between the non-inversion input terminal of the buffer and the terminal of the SAW resonator adjacent a downstream end of the feedback loop.

13. An electronic device, comprising a clock converter according to claims 7.

* * * * *